(12) United States Patent
Kimura et al.

(10) Patent No.: US 7,705,618 B2
(45) Date of Patent: Apr. 27, 2010

(54) COMPOSITE CONDUCTIVE SHEET, METHOD FOR PRODUCING THE SAME, ANISOTROPIC CONDUCTIVE CONNECTOR, ADAPTER, AND CIRCUIT DEVICE ELECTRIC INSPECTION DEVICE

(75) Inventors: Kiyoshi Kimura, Hidaka (JP); Fujio Hara, Hidaka (JP); Ken-ichi Koyama, Hidaka (JP); Sugiro Shimoda, Hidaka (JP)

(73) Assignee: JSR Corporation, Tokyo (JP)

( * ) Notice: Subject to any disclaimer, the term of this patent is extended or adjusted under 35 U.S.C. 154(b) by 260 days.

(21) Appl. No.: 11/815,506

(22) PCT Filed: Jan. 11, 2006

(86) PCT No.: PCT/JP2006/300170

§ 371 (c)(1),
(2), (4) Date: Aug. 3, 2007

(87) PCT Pub. No.: WO2006/087877

PCT Pub. Date: Aug. 24, 2006

(65) Prior Publication Data

US 2009/0039905 A1  Feb. 12, 2009

(30) Foreign Application Priority Data

Feb. 16, 2005 (JP) .............................. 2005-038668

(51) Int. Cl.
  *G01R 1/073* (2006.01)
  *G01R 31/28* (2006.01)
(52) U.S. Cl. ...................................... 324/754; 324/765
(58) Field of Classification Search .......... 324/754–765
  See application file for complete search history.

(56) References Cited

U.S. PATENT DOCUMENTS 4,322,682 A * 3/1982 Schadwill ................... 324/761
6,147,505 A * 11/2000 Ott et al. ..................... 324/754
6,854,985 B1 * 2/2005 Weiss ............................ 439/91
7,059,874 B2 * 6/2006 Weiss ............................ 439/91
7,063,542 B2 * 6/2006 Weiss et al. ................... 439/67

FOREIGN PATENT DOCUMENTS

| JP | 6 39961 | 2/1994 |
| JP | 2001 351702 | 12/2001 |
| JP | 2004 309467 | 11/2004 |

OTHER PUBLICATIONS

U.S. Appl. No. 11/994,865, filed Jan. 7, 2008, Kimura, et al.
U.S. Appl. No. 12/089,608, filed Apr. 9, 2008, Yamada, et al.

* cited by examiner

*Primary Examiner*—Ernest F Karlsen
(74) *Attorney, Agent, or Firm*—Oblon, Spivak, McClelland, Maier & Neustadt, L.L.P.

(57) ABSTRACT

Disclosed herein are a composite conductive sheet that has rigid conductors movable in a thickness-wise direction of an insulating sheet without falling off from the insulating sheet and is easy to handle by itself, a production process thereof, and an anisotropically conductive connector, an adaptor device and an electrical inspection apparatus for circuit devices, which are each equipped with this composite conductive sheet.

The composite conductive sheet of the invention has an insulating sheet, in which a plurality of through-holes each extending in a thickness-wise direction of the sheet are formed, and rigid conductors arranged respectively in the through-holes in the insulating sheet so as to protrude from both surfaces of the insulating sheet, wherein each of the rigid conductors has terminal portions formed on both ends of a body portion inserted into the through-hole in the insulating sheet and each having a diameter greater than a diameter of the through-hole in the insulating sheet, and is movable in the thickness-wise direction of the insulating sheet.

12 Claims, 10 Drawing Sheets

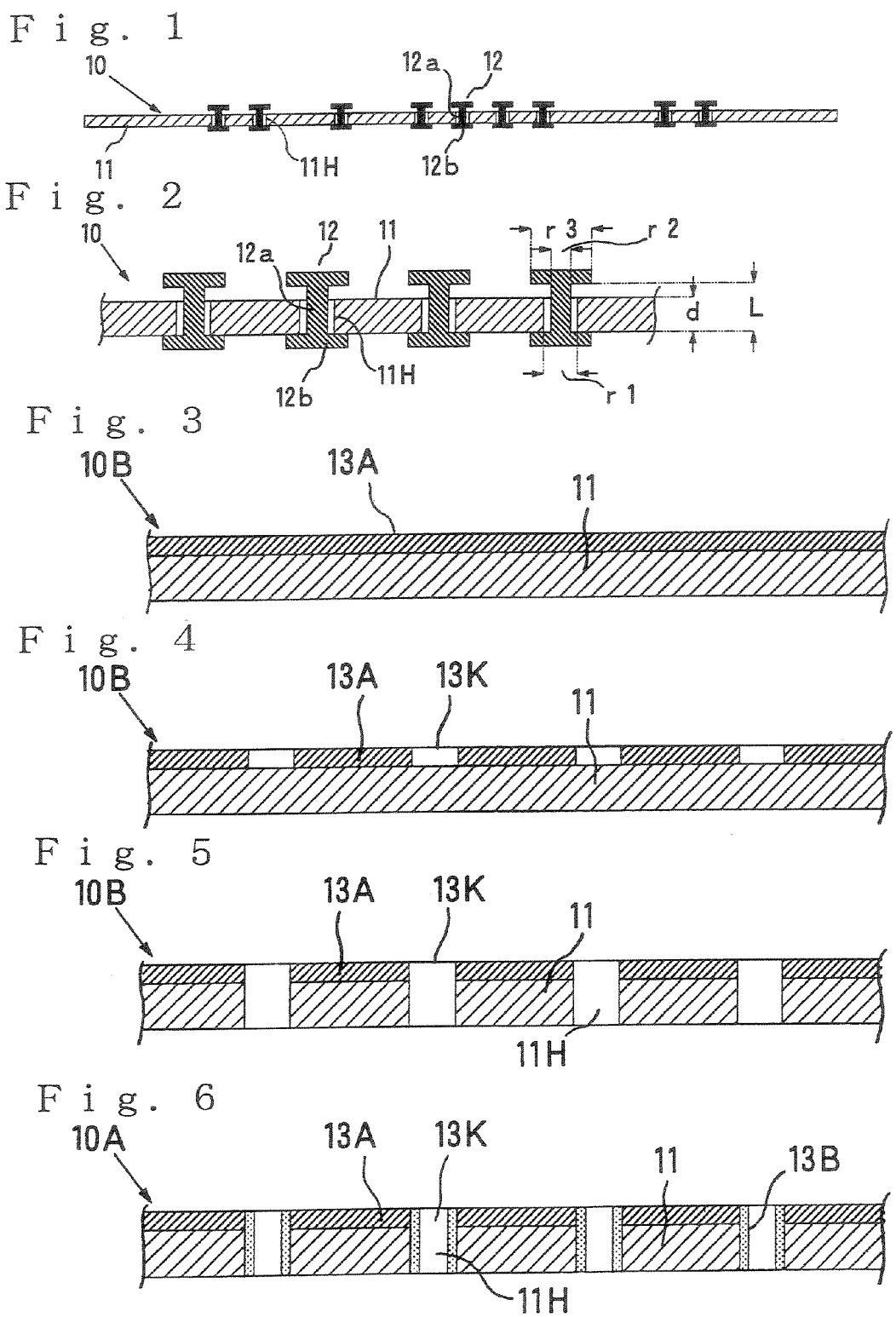

COMPOSITE CONDUCTIVE SHEET, METHOD FOR PRODUCING THE SAME, ANISOTROPIC CONDUCTIVE CONNECTOR, ADAPTER, AND CIRCUIT DEVICE ELECTRIC INSPECTION DEVICE

TECHNICAL FIELD

The present invention relates to a composite conductive sheet that can be suitably used in electrical inspection of circuit devices, for example, printed circuit boards, and a production process thereof, an anisotropically conductive connector, an adaptor device equipped with this connector, and an electrical inspection apparatus for circuit devices, which is equipped with this adaptor device.

BACKGROUND ART

With respect to a circuit board for making up or mounting electronic parts, such as packaged LSIs such as BGA and CSP, MCM, and other integrated circuit devices, it is generally necessary to inspect the electrical properties of the circuit board before the electronic parts are assembled or mounted for the purpose of confirming that a wiring pattern of the circuit board has the expected performance.

As a method for performing electrical inspection of a circuit board, there has heretofore been known a method making combined use of an inspection electrode device, in which a plurality of inspection electrodes are arranged according to positions of lattice points located vertically and laterally, and an adaptor for electrically connecting the inspection electrodes of this inspection electrode device to electrodes to be inspected of a circuit board that is an object of inspection, or the like. The adaptor used in this method is composed of a printed wiring board called a pitch-changing board.

As this adaptor, are known that having, on one surface thereof, a plurality of connecting electrodes arranged in accordance with a pattern corresponding to electrodes to be inspected of a circuit board, which is an object of inspection, and, on the other surface, a plurality of terminal electrodes arranged at positions of lattice points of the same pitch as inspection electrodes of an inspection electrode device, that having, on one surface thereof, plural pairs of connecting electrodes each composed of a connecting electrode for current supply and a connecting electrode for voltage measurement and arranged in accordance with a pattern corresponding to electrodes to be inspected of a circuit board, which is an object of inspection, and, on the other surface, a plurality of terminal electrodes arranged at positions of lattice points of the same pitch as inspection electrodes of an inspection electrode device, and the like. The former adaptor is used in, for example, an open short-circuit test of each circuit in a circuit board, and the latter adaptor is used in an electric resistance-measuring test of each circuit in a circuit board.

In order to achieve stable electrical connection of the circuit board, which is the object of inspection, to the adaptor in the electrical inspection of the circuit board, it is generally conducted to cause an anisotropically conductive elastomer sheet to intervene between the circuit board, which is the object of inspection, and the adaptor.

This anisotropically conductive elastomer sheet is a sheet exhibiting conductivity only in its thickness-wise direction or having a great number of pressure-sensitive conductive conductor parts exhibiting conductivity only in the thickness-wise direction when they are pressurized.

Those of various structures have heretofore been known as such anisotropically conductive elastomer sheets. For example, Patent Art. 1 discloses an anisotropically conductive elastomer sheet (hereinafter also referred to as "dispersion type anisotropically conductive sheet") with conductive particles exhibiting magnetism contained in a state that the conductive particles have been oriented in an elastic polymeric substance so as to align in a thickness-wise direction of the sheet to form chains, and in a state that the chains formed of the conductive particles have been dispersed in a plane direction of the sheet, Patent Art. 2 discloses an anisotropically conductive elastomer sheet (hereinafter also referred to as "uneven distribution type anisotropically conductive sheet") obtained by unevenly distributing conductive particles exhibiting magnetism in an elastomer, thereby forming a great number of conductive path-forming parts each extending in a thickness-wise direction of the sheet and an insulating part mutually insulating them, and Patent Art. 3 discloses an uneven distribution type anisotropically conductive sheet with a difference in level defined between the surface of each conductive path-forming part and an insulating part.

These anisotropically conductive elastomer sheets are obtained by, for example, subjecting a molding material layer with conductive particles exhibiting magnetism contained in a liquid polymeric substance-forming material, which will become an elastic polymeric substance by being cured, to a curing treatment while or after a magnetic field is applied to the molding material layer in a thickness-wise direction thereof. In such an anisotropically conductive elastomer sheet, the conductive particles are contained in the base material composed of the elastic polymeric substance in a state oriented so as to align in the thickness-wise direction to form chains, and a conductive path by a chain formed of the conductive particles is formed by pressurizing the sheet in the thickness-wise direction.

When the dispersion type anisotropically conductive sheet is compared with the uneven distribution type anisotropically conductive sheet, the dispersion type anisotropically conductive sheet has the advantage compared with the uneven distribution type anisotropically conductive sheet in that the dispersion type anisotropically conductive sheet can be produced at low cost without using a special and expensive mold and can be used irrespective of the pattern of electrodes to be connected and thus has general-purpose property.

On the other hand, in the uneven distribution type anisotropically conductive sheet, the insulating part mutually insulating adjacent conductive path-forming parts is formed between the adjacent conductive path-forming parts, so that the uneven distribution type anisotropically conductive sheet has the advantage of having performance that electrical connection to respective electrodes can be achieved in a state that necessary insulating property has been secured between adjacent electrodes even about an object of connection, in which a clearance between adjacent electrodes is small, i.e., having high resolving power compared with the dispersion type anisotropically conductive sheet.

In order to improve resolving power in the dispersion type anisotropically conductive sheet, it is essential to make the thickness of the dispersion type anisotropically conductive sheet small.

However, an anisotropically conductive elastomer sheet having a small thickness involves a problem that performance that variations of height in respective electrodes to be connected can be absorbed to achieve electrical connection to the electrodes, i.e., irregularity-absorbing ability is low. More specifically, the irregularity-absorbing ability of an anisotropically conductive elastomer sheet is about 20% of the thickness of the anisotropically conductive elastomer sheet. For example, in an anisotropically conductive elastomer sheet having a thickness of 100 µm, stable electrical connection can be achieved even to an object of connection, in which variations of height in electrodes are about 20 µm. In an anisotropically conductive elastomer sheet having a thickness of 50

μm, it is however difficult to achieve stable electrical connection to an object of connection, in which variations of height in electrodes exceed 10 μm.

In order to solve such a problem, there has been proposed an anisotropically conductive connector composed of a composite conductive sheet including an insulating sheet and tapered movable conductors fitted to tapered through-holes formed in the insulating sheet and provided in the through-holes movably in a thickness-wise direction of the insulating sheet, and two anisotropically conductive elastomer sheets respectively arranged on both surfaces of the composite conductive sheet. (see, for example, Patent Art. 4).

According to the anisotropically conductive connector having such a composite conductive sheet, the movable electrodes in the composite conductive sheet are provided movably in the thickness-wise direction of the sheet, so that the two anisotropically conductive elastomer sheets arranged respectively on one surface and the other surface of the composite conductive sheet are compressed and deformed interlockingly with each other when pressurized in the thickness-wise direction, and so the total of the irregularity-absorbing abilities possessed by both elastomer sheets is developed as the irregularity-absorbing ability of the anisotropically conductive connector. Accordingly, high irregularity-absorbing ability can be achieved.

It is only necessary to secure the thickness required to achieve necessary irregularity-absorbing ability by the total thickness of the two anisotropically conductive elastomer sheets, so that anisotropically conductive elastomer sheets having a small thickness may be used as the respective anisotropically conductive elastomer sheets, and so high resolving power can be achieved.

However, the above-described anisotropically conductive connector actually involves the following problems.

In the anisotropically conductive connector as above, the movable conductors in the composite conductive sheet are supported by both insulating sheet and anisotropically conductive elastomer sheets, and the movable conductors may possibly fall off from the insulating sheet when the composite conductive sheet is separated from the anisotropically conductive elastomer sheets, so that it is actually extremely difficult to handle the composite conductive sheet by itself. Accordingly, when trouble occurs on one of the composite conductive sheet and the anisotropically conductive elastomer sheets in the anisotropically conductive connector, only the composite conductive sheet or anisotropically conductive elastomer sheet cannot be replaced by new one, and the whole anisotropically conductive connector must be replaced by new one.

The movable conductors of the composite conductive sheet are obtained by depositing a metal in each of the tapered through-holes formed in the insulating sheet by a plating treatment to form a metal body and mechanically pressing this metal body, thereby separating the metal body adhered to the inner surface of the through-hole. However, when an anisotropically conductive connector having a great number of movable conductors is produced, it is difficult to surely separate all metal bodies formed in the insulating sheet from the respective inner surfaces of the insulating sheet, so that inconvenience is caused to the function of a part of the movable conductors.

Patent Art. 1: Japanese Patent Application Laid-Open No. 93393/1976;
Patent Art. 2: Japanese Patent Application Laid-Open No. 147772/1978;
Patent Art. 3: Japanese Patent Application Laid-Open No. 250906/1986;
Patent Art. 4: Japanese Patent Application Laid-Open No. 2001-351702.

DISCLOSURE OF THE INVENTION

The present invention has been made on the basis of the foregoing circumstances and has as its first object the provision of a composite conductive sheet that has rigid conductors movable in a thickness-wise direction of an insulating sheet without falling off from the insulating sheet and is easy to handle by itself.

The second object of the present invention is to provide a process for producing the composite conductive sheet, by which the movable rigid conductors can be surely formed.

The third object of the present invention is to provide an anisotropically conductive connector, by which electrical connection to respective electrodes can be surely achieved in a state that necessary insulating property has been secured between adjoining electrodes even in an object of connection, in which a clearance between electrodes adjoining each other is small, and there are variations of height in the respective electrodes.

The fourth object of the present invention is to provide an adaptor device, by which electrical connection to respective electrodes to be inspected can be surely achieved in a state that necessary insulating property has been secured between adjoining electrodes to be inspected even when a circuit device, which is an object of inspection, is small in the clearance between adjoining electrodes to be inspected, and there are variations of height in the electrodes to be inspected.

The fifth object of the present invention is to provide an electrical inspection apparatus for circuit devices, by which necessary electrical inspection on a circuit device, which is an object of inspection, can be surely performed even when the circuit device is small in the clearance between adjoining electrodes to be inspected, and there are variations of height in electrodes to be inspected.

A composite conductive sheet according to the present invention comprises an insulating sheet, in which a plurality of through-holes each extending in a thickness-wise direction of the sheet are formed, and rigid conductors arranged respectively in the through-holes in the insulating sheet so as to protrude from both surfaces of the insulating sheet, wherein each of the rigid conductors has terminal portions formed on both ends of a body portion inserted into the through-hole in the insulating sheet and each having a diameter greater than a diameter of the through-hole in the insulating sheet, and is movable in the thickness-wise direction of the insulating sheet.

In the composite conductive sheet according to the present invention, a movable distance of the rigid conductor in the thickness-wise direction of the insulating sheet may preferably be 3 to 150 μm.

A process for producing a composite conductive sheet according to the present invention is a process for producing the above-described composite conductive sheet, which comprises producing a composite laminate material composed of an insulating sheet, in which a plurality of through-holes each extending in a thickness-wise direction of the sheet are formed, an easily etchable metal layer laminated on at least one surface of the insulating sheet and having a plurality of openings respectively linked to the through-holes in the insulating sheet, and easily etchable thin metal layers each formed so as to cover an inner wall surface of the through-hole in the insulating sheet and an opening edge of the metal layer; subjecting the composite laminate material to a photo-plating treatment, thereby forming rigid conductors in the through-holes in the insulating sheet in the composite laminate material; and then removing the metal layer and thin metal layers in the composite laminate material by an etching treatment.

An anisotropically conductive connector according to the present invention comprises the above-described composite conductive sheet, a first anisotropically conductive elastomer sheet arranged on one surface of the composite conductive sheet and a second anisotropically conductive elastomer sheet arranged on the other surface of the composite conductive sheet.

In the anisotropically conductive connector according to the present invention, each of the first anisotropically conductive elastomer sheet and second anisotropically conductive elastomer sheet may preferably contain conductive particles exhibiting magnetism in a state that the conductive particles have been oriented in an elastic polymeric substance so as to align in a thickness-wise direction of the sheet to form chains, and in a state that the chains formed of the conductive particles have been distributed in a plane direction of the sheet.

In such an anisotropically conductive connector, each of the first anisotropically conductive elastomer sheet and second anisotropically conductive elastomer sheet may preferably have a thickness of 20 to 100 µm.

The conductive particles may preferably have a number average particle diameter of 3 to 20 µm.

An adaptor device according to the present invention comprises
an adaptor body having a connecting electrode region, on the surface of which a plurality of connecting electrodes are formed in accordance with a pattern corresponding to electrodes to be inspected in a circuit device to be inspected, and
the above-described anisotropically conductive connector arranged on the connecting electrode region of the adaptor body and having a plurality of the rigid conductors formed in accordance with a pattern corresponding to the connecting electrodes in the adaptor body.

An adaptor device according to the present invention comprises
an adaptor body having a connecting electrode region, on the surface of which plural pairs of connecting electrodes each composed of two connecting electrodes for current supply and for voltage measurement are formed in accordance with a pattern corresponding to electrodes to be inspected in a circuit device to be inspected, and
the above-described anisotropically conductive connector arranged on the connecting electrode region of the adaptor body and having a plurality of the rigid conductors formed in accordance with a pattern corresponding to the connecting electrodes in the adaptor body.

An electrical inspection apparatus according to the present invention for circuit devices comprises the above-described adaptor device.

The composite conductive sheet according to the present invention has the rigid conductors movable in the thickness-wise direction of the insulating sheet in the through-holes in the insulating sheet, and the rigid conductors each have the terminal portions having a diameter greater than the diameter of the through-hole in the insulating sheet and formed on both ends of the body portion, so that the terminal portions function as a stopper. As a result, the rigid conductors do not fall off from the insulating sheet, and so the composite conductive sheet is easy to handle even by itself.

According to the production process of the composite conductive sheet of the present invention, the easily etchable metal layer and the thin metal layers are formed on the surface of the insulating sheet and the inner wall surfaces of the through-holes, respectively, the rigid conductors are formed in the through-holes in the insulating sheet, and the metal layer and thin metal layers are then removed by an etching treatment, so that a necessary gap is surely formed between the insulating sheet and each rigid conductor. As a result, the movable rigid conductors can be surely formed.

According to the anisotropically conductive connector of the present invention, each of the rigid conductors in the composite conductive sheet is provided movably in the thickness-wise direction of the insulating sheet, so that the first anisotropically conductive elastomer sheet arranged on one surface of the composite conductive sheet and the second anisotropically conductive elastomer sheet arranged on the other surface of the composite conductive sheet are compressed and deformed interlockingly with each other by the movement of the rigid conductors in the thickness-wise direction of the insulating sheet when pressurized in the thickness-wise direction by electrodes to be connected, and so the total of the irregularity-absorbing abilities possessed by both elastomer sheets is developed as the irregularity-absorbing ability of the anisotropically conductive connector. Accordingly, high irregularity-absorbing ability can be achieved.

It is only necessary to secure the thickness required to achieve necessary irregularity-absorbing ability by the total thickness of the first anisotropically conductive elastomer sheet and second anisotropically conductive elastomer sheet, so that anisotropically conductive elastomer sheets having a small thickness may be used as the respective anisotropically conductive elastomer sheets, and so high resolving power can be achieved.

Accordingly, electrical connection to respective electrodes can be surely achieved in a state that necessary insulating property has been secured between adjacent electrodes even about an object of connection, in which a clearance between adjacent electrodes is small, and there are variations of height in the respective electrodes.

According to the adaptor device of the present invention, the above-described anisotropically conductive connector is provided, so that electrical connection to respective electrodes to be inspected can be surely achieved in a state that necessary insulating property has been secured between adjacent electrodes to be inspected even when a circuit device, which is an object of inspection, is small in the clearance between adjoining electrodes to be inspected, and there are variations of height in the electrodes to be inspected.

According to the electrical inspection apparatus of the present invention for circuit devices, the above-described adaptor device is provided, so that necessary electrical inspection on a circuit device, which is an object of inspection, can be surely performed even when the circuit device is small in the clearance between adjoining electrodes to be inspected, and there are variations of height in electrodes to be inspected.

BRIEF DESCRIPTION OF THE DRAWINGS

FIG. 1 is a cross-sectional view illustrating the construction of an exemplary composite conductive sheet according to the present invention.

FIG. 2 is a cross-sectional view illustrating, on an enlarged scale, the construction of a principal part of the composite conductive sheet shown in FIG. 1.

FIG. 3 is a cross-sectional view illustrating the construction of a laminate material for producing the composite conductive sheet.

FIG. 4 is a cross-sectional view illustrating a state that openings have been formed in a metal layer in the laminate material.

FIG. 5 is a cross-sectional view illustrating a state that through-holes have been formed in an insulating sheet in the laminate material.

FIG. 6 is a cross-sectional view illustrating the construction of a composite laminate material.

DESCRIPTION OF CHARACTERS

Figure 7:
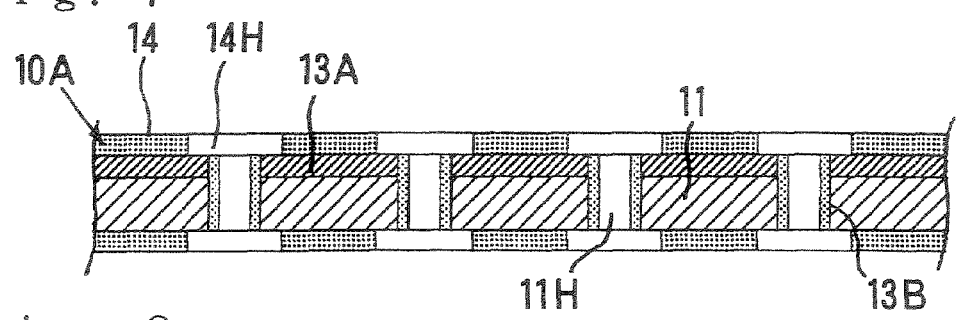
FIG. 7 is a cross-sectional view illustrating a state that a resist film has been formed on the composite laminate material.

1a Upper-side adaptor device
1b Lower-side adaptor device
2 Holder
5 Circuit device
6, 7 Electrodes to be inspected
10 Composite conductive sheet
10A Composite laminate material
10B Laminate material
11 Insulating sheet
11H Through-hole
12 Rigid conductor
12a Body portion
12b Terminal portion
13A Metal layer
13B Thin metal layer
13K Opening
14 Resist layer
14H Pattern hole
15 Anisotropically conductive connector
16 First anisotropically conductive elastomer sheet
16A Layer of material for conductive elastomer
16B Material for conductive elastomer
17 Second anisotropically conductive elastomer sheet
20 Adaptor body
21, 21b, 21c Connecting electrodes
21a Pair of connecting electrodes
22 Terminal electrode
23 Internal wiring part
25 Connecting electrode region
30 One surface-side molding member
31 Other surface-side molding member
32 Spacer
32K Opening
33 Press roll
34 Supporting roll
35 Press roll device
50a Upper-side inspection head
50b Lower-side inspection head
51a, 51b Inspection electrode devices
52a, 52b Inspection electrodes
53a, 53b Electrical wires
54a, 54b Supports
55a, 55b Anisotropically conductive elastomer sheets
56a Upper-side supporting plate
56b Lower-side supporting plate
57a, 57b Connectors 60a Upper-side inspection head
60b Lower-side inspection head
61a, 61b Inspection electrode devices
62a, 62b Insulating substrates
63a, 63b Through-holes
64a, 64b Electrical wires
65a, 65b Fixing members
66a, 66b Inspection electrodes
70a, 70b Anisotropically conductive connectors
71a, 71b First anisotropically conductive elastomer sheets
72a, 72b Conductive path-forming parts
73a, 73b Insulating parts
75a, 75b Second anisotropically conductive elastomer sheets
76a, 76b Conductive path-forming parts
77a, 77b Insulating parts

BEST MODE FOR CARRYING OUT THE INVENTION

The embodiments of the present invention will hereinafter be described in details.

<Composite Conductive Sheet>

FIG. 1 is a cross-sectional view illustrating the construction of an exemplary composite conductive sheet according to the present invention, and FIG. 2 is a cross-sectional view illustrating, on an enlarged scale, rigid conductors of the composite conductive sheet shown in FIG. 1. This composite conductive sheet 10 is constructed by an insulating sheet 11, in which a plurality of through-holes 11H each extending in a thickness-wise direction of the sheet are formed in accordance with a pattern corresponding to a pattern of electrodes to be connected, and a plurality of rigid conductors 12 arranged respectively in the through-holes 11H in the insulating sheet so as to protrude from both surfaces of the insulating sheet 11.

Each of the rigid conductors 12 is formed by a columnar body portion 12a inserted into the through-hole 11H in the insulating sheet 11 and terminal portions 12b integrally joined to and respectively formed on both ends of the columnar portion 12a and exposed to the surfaces of the insulating sheet 11. The length L of the body portion 12a in the rigid conductor 12 is greater than the thickness d of the insulating sheet 11, and the diameter r2 of the body portion 12a is smaller than the diameter r1 of the through-hole 11H in the insulating sheet 11, whereby the rigid conductor 12 is movable in a thickness-wise direction of the insulating sheet 11. The diameter r3 of each of the terminal portions 12b in the rigid conductor 12 is greater than the diameter r1 of the through-hole 11H in the insulating sheet 11.

As a material for forming the insulating sheet 11, may be used a resin material such as a liquid crystal polymer, polyimide resin, polyester resin, polyaramide resin or polyamide resin, a fiber-reinforced resin material such as a glass fiber-reinforced epoxy resin, glass fiber-reinforced polyester resin or glass fiber-reinforced polyimide resin, or a composite resin material with an inorganic material such as alumina or boron nitride contained as a filler in an epoxy resin or the like.

When the composite conductive sheet 10 is used under a high-temperature environment, that having a coefficient of linear thermal expansion of at most $3\times10^{-5}$/K, more preferably $1\times10^{-6}$ to $2\times10^{-5}$/K, particularly preferably $1\times10^{-6}$ to $6\times10^{-6}$/K is preferably used as the insulating sheet 11. Such an insulating sheet 11 is used, whereby positional deviation of the rigid conductors 12 due to the thermal expansion of the insulating sheet 11 can be inhibited.

The thickness d of the insulating sheet 11 is preferably 10 to 200 μm, more preferably 15 to 100 μm.

The diameter r1 of each of the through-holes 11H in the insulating sheet 11 is preferably 20 to 300 μm, more preferably 30 to 150 μm.

As a material for forming the rigid conductors 12, may be suitably used a metallic material having rigidity. In particular, a material harder to be etched than a thin metal layer formed on the insulating sheet in a production process, which will be described subsequently, is preferably used. As specific examples of such a metallic material, may be mentioned simple metals such as nickel, cobalt, gold and aluminum, and alloys of these metals.

The diameter r2 of the body portion 12a in each of the rigid conductors 12 is preferably at least 18 μm, more preferably at least 25 μm. If this diameter r2 is too small, necessary strength may not be achieved on such rigid conductors 12 in some cases. A difference (r1−r2) between the diameter r1 of the through-hole 11H in the insulating sheet 11 and the diameter r2 of the body portion 12a in the rigid conductor 12 is preferably at least 1 μm, more preferably at least 2 μm. If this difference is too small, it may be difficult in some cases to move the rigid conductors 12 in the thickness-wise direction of the insulating sheet 11.

The diameter r3 of each of the terminal portions 12b in the rigid conductor 12 is preferably 70 to 150% of a diameter of an electrode to be connected, for example, an electrode to be inspected. A difference (r3−r1) between the diameter r3 of each of the terminal portions 12b in the rigid conductor 12 and the diameter r1 of the through-hole 11H in the insulating sheet 11 is preferably at least 5 μm, more preferably at least 10 μm. If this difference is too small, the rigid conductors 12 may possibly fall off from the insulating sheet 11.

The thickness of each of the terminal portions 12b in the rigid conductor 12 is preferably 5 to 50 μm, more preferably 8 to 40 μm.

A movable distance of the rigid conductor 12 in the thickness-wise direction of the insulating sheet 11, i.e., a difference (L−d) between the length L of the body portion 12a in the rigid conductor 12 and the thickness d of the insulating sheet 11, is preferably 3 to 150 μm, more preferably 5 to 100 μm, still more preferably 10 to 50 μm. If the movable distance of the rigid conductor 12 is too small, it may be difficult in some cases to achieve sufficient irregularity-absorbing ability in an anisotropically conductive connector, which will be described subsequently. If the movable distance of the rigid conductor 12 is too great on the other hand, the length of the body portion 12a of the rigid conductor 12 exposed from the through-hole 11H in the insulating sheet 11 becomes great, so that the body portion 12a of the rigid conductor 12 may possibly be buckled or damaged when the composite conductive sheet is used in inspection.

Such a composite conductive sheet 10 has the rigid conductors 12 movable in the thickness-wise direction of the insulating sheet in the through-holes 11H in the insulating sheet 11, and the rigid conductors 12 each have the terminal portions 12b having a diameter greater than the diameter of the through-hole 11H in the insulating sheet 11 and formed on both ends of the body portion 12a thereof, so that the terminal portions 12b function as a stopper. As a result, the rigid conductors 12 do not fall off from the insulating sheet 11, and so the composite conductive sheet 10 is easy to handle even by itself.

The composite above-described conductive sheet 10 can be produced in accordance with, for example, the following manner.

A laminate material 10B obtained by integrally laminating an easily etchable metal layer 13A on one surface of an insulating sheet 11 is first provided as illustrated in FIG. 3, and the metal layer 13A in the laminate material 10B is subjected to an etching treatment to remove a part thereof, thereby forming a plurality of openings 13K in accordance with a pattern corresponding to a pattern of electrodes to be connected in the metal layer 13A as illustrated in FIG. 4. Through-holes 11H respectively linked to the openings 13K of the metal layer 13A and each extending in a thickness-wise direction of the insulating sheet are then formed in the insulating sheet 11 in the laminate material 10B as illustrated in FIG. 5. Easily etchable cylindrical thin metal layers 13B are then formed so as to cover the inner wall surfaces of the through-holes 11H in the insulating sheet 11 and the opening edges of the metal layer 13A as illustrated in FIG. 6. In such a manner, a composite laminate material 10A composed of the insulating sheet 11, in which a plurality of the through-holes 11H each extending in the thickness-wise direction have been formed, the easily etchable metal layer 13A laminated on one surface of the insulating sheet 11 and having a plurality of the openings 13K respectively linked to the through-holes 11H in the insulating sheet 11r and the easily etchable thin metal layers 13B each formed so as to cover the inner wall surface of the through-hole 11H in the insulating sheet 11 and the opening edge of the metal layer 13A is produced.

In the above-described production process, as a method for forming the through-holes 11H in the insulating sheet 11, may be used a laser beam machining method, drill machining method, etching method or the like.

As an easily etchable metallic material for forming the metal layer 13A and the thin metal layer 13B, may be used copper or the like.

The thickness of the metal layer 13A is preset in view of the intended movable distance of each of the rigid conductors 12, or the like. Specifically, the thickness is preferably 3 to 75 µm, more preferably 5 to 50 µm, still more preferably 8 to 25 µm.

The thickness of the thin metal layer 13B is preset in view of the diameter of the through-hole 11H in the insulating sheet 11 and the diameter of the body portion 12a in each of the rigid conductors 12 to be formed.

As a method for forming the thin metal layer 13B, may be used an electroless plating method or the like.

Figure 8:
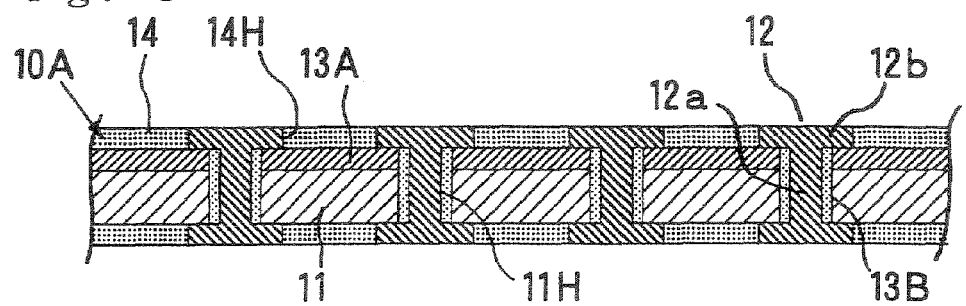
FIG. 8 is a cross-sectional view illustrating a state that rigid conductors have been formed in the through-holes in the insulating sheet in the composite laminate material.

This composite laminate material 10A is subjected to a photo-plating treatment, thereby forming the rigid conductors 12 in the respective through-holes 11H in the insulating sheet 11. Specifically, resist films 14, in which a plurality of pattern holes 14H respectively linked to the through-holes 11H in the insulating sheet 11 have been formed in accordance with a pattern corresponding to a pattern of the terminal portions 12b in the rigid conductors 12 to be formed, are respectively formed on the surface of the metal layer 13A formed on one surface of the insulating sheet 11 and the other surface of the insulating sheet 11 as illustrated in FIG. 7. An electroplating treatment is then conducted by using the metal layer 13A as a common electrode to deposit a metal on exposed portions in the metal layer 13A and at the same time to deposit a metal on the surfaces of the thin metal layers 13B so as to fill the metal into the through-holes 11H in the insulating sheet 11 and the pattern holes 14H in the resist films 14, thereby forming the rigid conductors 12 each extending in a thickness-wise direction of the insulating sheet 11 as illustrated in FIG. 8.

Figure 9:
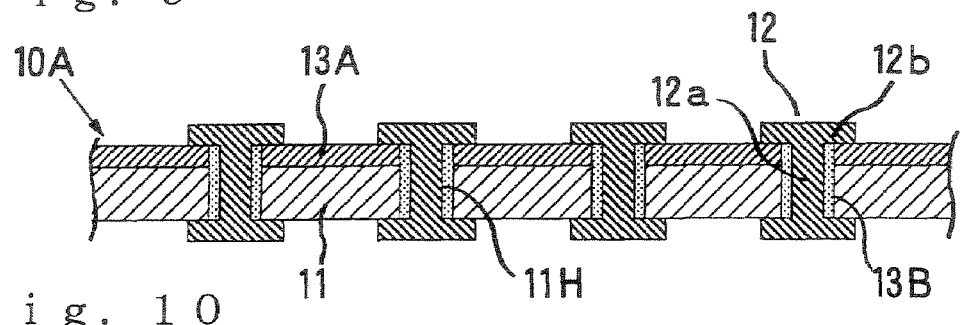
FIG. 9 is a cross-sectional view illustrating a state that the resist film has been removed from the composite laminate material.

After the rigid conductors 12 are formed in such a manner, the resist film 14 is removed from the surface of the metal layer 13A, thereby exposing the metal layer 13A as illustrated in FIG. 9. An etching treatment is then conducted to remove the metal layer 13A and the thin metal layers 13B, thereby obtaining the composite conductive sheet 10 illustrated in FIG. 1.

According to such a production process, the easily etchable metal layer 13A and the thin metal layers 13B are formed on one surface of the insulating sheet 11 and the inner wall surfaces of the through-holes 11H, respectively, the rigid conductors 12 are formed in the through-holes 11H in the insulating sheet 11, and the metal layer 13A and the thin metal layers 13B are then removed by an etching treatment, so that a necessary gap is surely formed between the insulating sheet 11 and each rigid conductor 12. As a result, the movable rigid conductors 12 can be surely formed.

<Anisotropically Conductive Connector>

Figure 10:
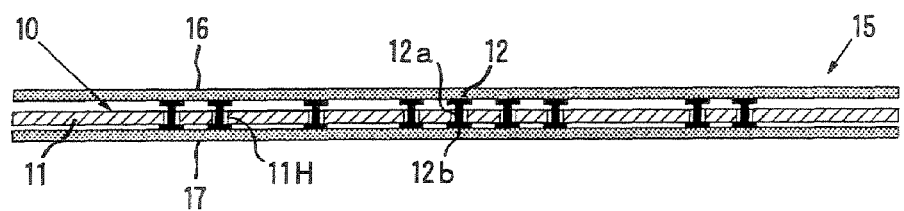
FIG. 10 is a cross-sectional view illustrating the construction of an exemplary anisotropically conductive connector according to the present invention.
Figure 11:
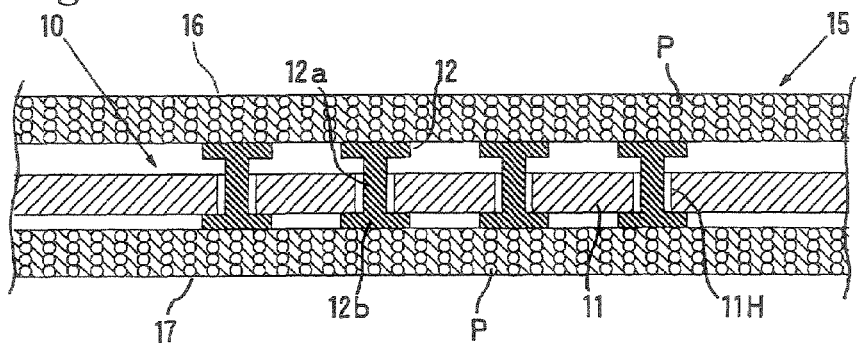
FIG. 11 is a cross-sectional view illustrating, on an enlarged scale, the construction of a principal part of the anisotropically conductive connector shown in FIG. 10.

FIG. 10 is a cross-sectional view illustrating the construction of an exemplary anisotropically conductive connector according to the present invention, and FIG. 11 is a cross-sectional view illustrating, on an enlarged scale, a principal part of the anisotropically conductive connector shown in FIG. 10. This anisotropically conductive connector 15 is constructed by the composite conductive sheet 10 of the construction shown in FIG. 1, a first anisotropically conductive elastomer sheet 16 arranged on one surface (upper surface in FIG. 10) of the composite conductive sheet 10 and a second anisotropically conductive elastomer sheet 17 arranged on the other surface of the composite conductive sheet 10.

In this embodiment, each of the first anisotropically conductive elastomer sheet 16 and second anisotropically conductive elastomer sheet 17 contains conductive particles P exhibiting magnetism in a state that the conductive particles have been oriented in an insulating elastic polymeric substance so as to align in a thickness-wise direction of the sheet to form chains, and in a state that the chains formed of the conductive particles P have been distributed in a plane direction of the sheet.

As the elastic polymeric substances forming the first anisotropically conductive sheet 16 and second anisotropically conductive sheet 17, are preferred polymeric substances having a crosslinked structure. As curable polymeric substance-forming materials usable for obtaining such elastic polymeric substances, may be used various materials. Specific examples thereof include conjugated diene rubbers such as polybutadiene rubber, natural rubber, polyisoprene rubber, styrene-butadiene copolymer rubber and acrylonitrile-butadiene copolymer rubber, and hydrogenated products thereof; block copolymer rubbers such as styrene-butadiene-diene block copolymer rubber and styrene-isoprene block copolymers, and hydrogenated products thereof; and besides chloroprene, urethane rubber, polyester rubber, epichlorohydrin rubber, silicone rubber, ethylene-propylene copolymer rubber and ethylene-propylene-diene terpolymer rubber. Among these, silicone rubber is preferably used from the viewpoints of durability, molding and processing ability and electrical properties.

As the silicone rubber, is preferred that obtained by crosslinking or condensing liquid silicone rubber. The liquid silicone rubber preferably has a viscosity not higher than $10^5$ poises as measured at a shear rate of $10^{-1}$ sec and may be any of condensation type, addition type and those having a vinyl group or hydroxyl group. As specific examples thereof, may be mentioned dimethyl silicone raw rubber, methylvinyl silicone raw rubber and methylphenylvinyl silicone raw rubber.

The silicone rubber preferably has a molecular weight Mw (weight average molecular weight as determined in terms of standard polystyrene; the same shall apply hereinafter) of 10,000 to 40,000. It also preferably has a molecular weight distribution index (a ratio Mw/Mn of weight average molecular weight Mw as determined in terms of standard polystyrene to number average molecular weight Mn as determined in terms of standard polystyrene; the same shall apply hereinafter) of at most 2 because an anisotropically conductive elastomer sheet good in heat resistance is obtained.

As the conductive particles P contained in the first anisotropically conductive elastomer sheet 16 and second anisotropically conductive elastomer sheet 17, conductive particles exhibiting magnetism are used in that such particles can be easily oriented so as to align in the thickness-wise direction by a process, which will be described subsequently. Specific examples of such conductive particles include particles of metals having magnetism, such as iron, cobalt and nickel, particles of alloys thereof, particles containing such a metal, particles obtained by using these particles as core particles and plating surfaces of the core particles with a metal having good conductivity, such as gold, silver, palladium or rhodium, and particles obtained by using particles of a non-magnetic metal, particles of an inorganic substance, such as glass beads, or particles of a polymer as core particles and plating surfaces of the core particles with a conductive magnetic metal such as nickel or cobalt.

Among these, particles obtained by using nickel particles as core particles and plating their surfaces with gold having good conductivity are preferably used.

No particular limitation is imposed on the means for coating the surfaces of the core particles with the conductive metal. However, for example, a chemical plating, electroplating, sputtering or vapor deposition process is used.

When those obtained by coating the surfaces of the core particles with the conductive metal are used as the conductive particles P, the coating rate (proportion of an area coated with the conductive metal to the surface area of the core particles) of the conductive metal on the particle surfaces is preferably at least 40%, more preferably at least 45%, particularly preferably 47 to 95% from the viewpoint of achieving good conductivity.

The amount of the conductive metal to coat is preferably 0.5 to 50% by mass, more preferably 2 to 30% by mass, still more preferably 3 to 25% by mass, particularly preferably 4 to 20% by mass based on the core particles. When the conductive metal to coat is gold, the coating amount thereof is preferably 0.5 to 30% by mass, more preferably 2 to 20% by mass, still more preferably 3 to 15% by mass based on the core particles.

The number average particle diameter of the conductive particles P is preferably 3 to 20 μm, more preferably 5 to 15 μm. If this number average particle diameter is too small, it may be difficult in some cases to orient the conductive particles P in the thickness-wise direction in the production process, which will be described subsequently. If this number average particle diameter is too great on the other hand, it may be difficult in some cases to obtain an anisotropically conductive elastomer sheet having high resolving power.

The particle diameter distribution (Dw/Dn) of the conductive particles P is preferably 1 to 10, more preferably 1.01 to 7, still more preferably 1.05 to 5, particularly preferably 1.1 to 4.

No particular limitation is imposed on the form of the conductive particles P. However, they are preferably in the form of a sphere or star, or secondary particles obtained by aggregating these particles from the viewpoint of permitting easy dispersion of these particles in the polymeric substance-forming material.

Those obtained by treating surfaces of the particles with a coupling agent such as a silane coupling agent, or a lubricant may be suitably used as the conductive particles P. By treating the surfaces of the particles with the coupling agent or lubricant, the durability of the resulting anisotropically conductive elastomer sheet is improved.

Such conductive particles P are preferably contained in a proportion of 10 to 40%, particularly 15 to 35% in terms of volume fraction in the anisotropically conductive elastomer sheet. If this proportion is too low, an anisotropically conductive elastomer sheet having sufficiently high conductivity in its thickness-wise direction may not be obtained in some cases. If this proportion is too high on the other hand, the resulting anisotropically conductive elastomer sheet is liable to be brittle, so that elasticity required of the anisotropically conductive elastomer sheet may not be achieved in some cases.

The thickness of each of the first anisotropically conductive elastomer sheet 16 and second anisotropically conductive elastomer sheet 17 is preferably 20 to 100 μm, more preferably 25 to 70 μm. If this thickness is too small, sufficient irregularity-absorbing ability may not be achieved in some cases. If this thickness is too great on the other hand, high resolving power may not be obtained in some cases.

The first anisotropically conductive elastomer sheet 16 can be produced in the following manner.

Figure 12:
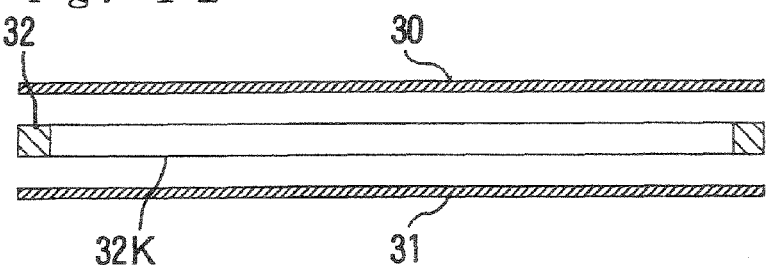
FIG. 12 is a cross-sectional view illustrating a one surface-side molding member, an other surface-side molding member and a spacer for producing a first anisotropically conductive elastomer sheet.

As illustrated in FIG. 12, a one surface-side molding member 30 and an other surface-side molding member 31, which are each in a sheet form, and a frame-like spacer 32 having an opening 32K having a shape fitted to a plane shape of the intended first anisotropically conductive elastomer sheet 16 and a thickness corresponding to the thickness of the first anisotropically conductive elastomer sheet 16 are first provided, and at the same time, a material for conductive elastomer with conductive particles contained in a liquid polymeric substance-forming material, which will become an elastic polymeric substance by being cured, is prepared.

Figure 13:
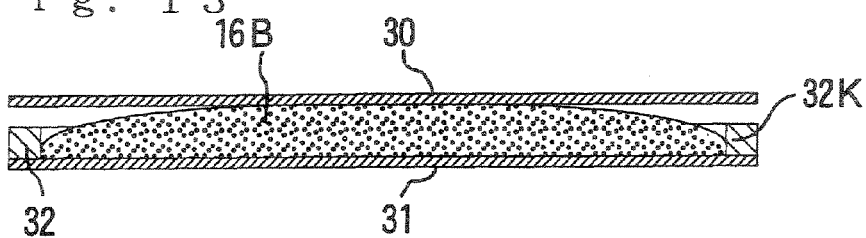
FIG. 13 is a cross-sectional view illustrating a state that the surface of the other surface-side molding member has been coated with a material for conductive elastomer.

As illustrated in FIG. 13, the spacer 32 is arranged on a molding surface (upper surface in FIG. 13) of the other surface-side molding member 31, the prepared material 16B for conductive elastomer is applied to within the opening 32K of the spacer 32 on the molding surface of the other surface-side molding member 31, and the one surface-side molding member 30 is then arranged on this material 16B for conductive elastomer in such a manner that the molding surface (lower surface in FIG. 13) thereof comes into contact with the material 16B for conductive elastomer.

In the above-described process, resin sheets composed of a polyimide resin, polyester resin, acrylic resin or the like may be used as the one surface-side molding member 30 and other surface-side molding member 31.

The thickness of each of the resin sheets making up the one surface-side molding member 30 and other surface-side molding member 31 is preferably 50 to 500 μm, more preferably 75 to 300 μm. If this thickness is smaller than 50 μm, strength required of the molding member may not be achieved in some cases. If this thickness exceeds 500 μm on the other hand, it may be difficult in some cases to apply a magnetic field of necessary intensity to a layer of a material for conductive elastomer, which will be described subsequently.

Figure 14:
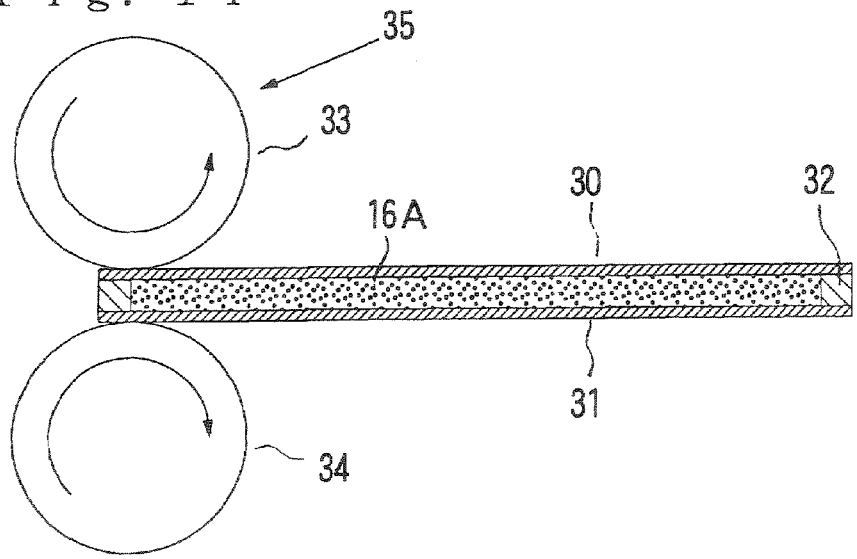
FIG. 14 is a cross-sectional view illustrating a state that a layer of the material for conductive elastomer has been formed between the one surface-side molding member and the other surface-side molding member.
Figure 15:
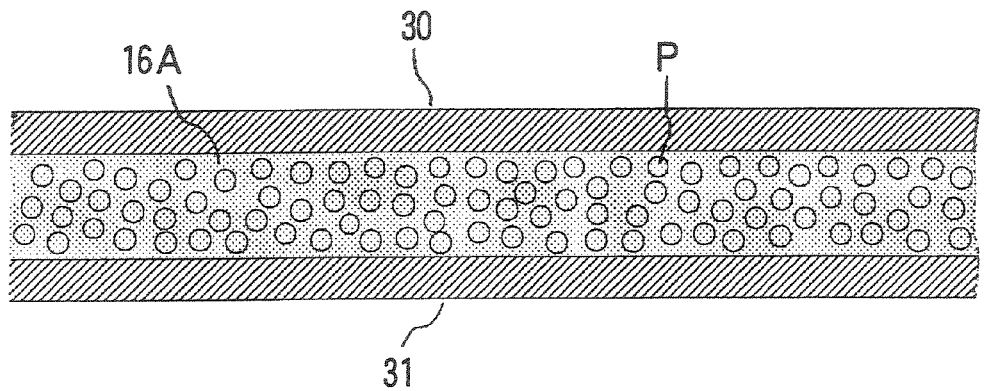
FIG. 15 is a cross-sectional view illustrating, on an enlarged scale, the layer of the material for conductive elastomer shown in FIG. 14.

As illustrated in FIG. 14, a press roll device 35 composed of a press roll 33 and a supporting roll 34 is then used to pinch the material 16B for conductive elastomer by the one surface-side molding member 30 and other surface-side molding member 31, thereby forming a layer 16A of the material for conductive elastomer having a necessary thickness between the one surface-side molding member 30 and the other surface-side molding member 31. In this layer 16A of the material for conductive elastomer, as illustrated on an enlarged scale in FIG. 15, the conductive particles P are contained in an evenly dispersed state.

Figure 16:
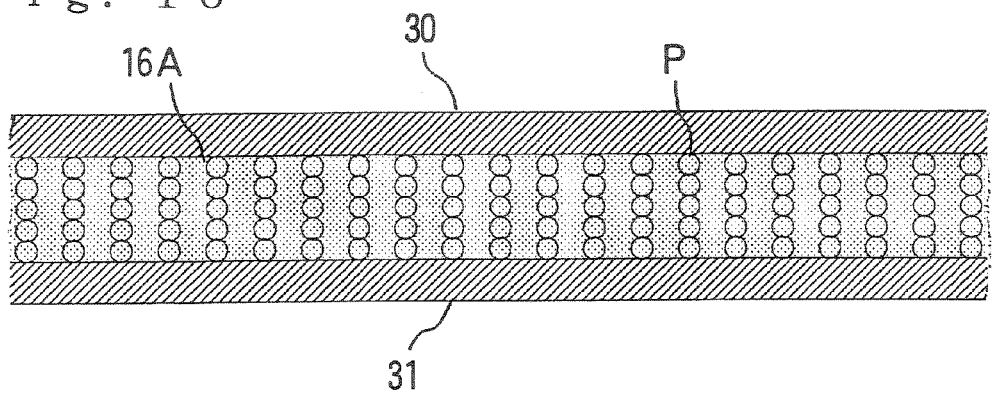
FIG. 16 is a cross-sectional view illustrating a state that a magnetic field has been applied to the layer of the material for conductive elastomer shown in FIG. 14 in a thickness-wise direction of the layer.

For example, a pair of electromagnets are then arranged on a back surface of the one surface-side molding member 30 and a back surface of the other surface-side molding member 31, and the electromagnets are operated, thereby applying a parallel magnetic field to the layer 16A of the material for conductive elastomer in its thickness-wise direction. As a result, in the layer 16A of the material for conductive elastomer, the conductive particles P dispersed in the layer 16A of the material for conductive elastomer are oriented so as to align in the thickness-wise direction while retaining the state distributed in a plane direction as illustrated in FIG. 16, whereby a plurality of chains each composed of the conductive particles P and extending in the thickness-wise direction are formed in the state distributed in the plane direction.

In this state, the layer 16A of the material for conductive elastomer is then subjected to a curing treatment, thereby producing the first anisotropically conductive elastomer sheet 16 containing the conductive particles P in a state that the conductive particles P have been oriented so as to align in the thickness-wise direction in the elastic polymeric substance and in a state that the chains formed of the conductive particles P have been distributed in the plane direction.

In the above-described process, the curing treatment of the layer 16A of the material for conductive elastomer may be conducted in the state that the parallel magnetic field is being applied. However, the treatment may also be conducted after stopping the application of the parallel magnetic field.

The intensity of the parallel magnetic field applied to the layer 16A of the material for conductive elastomer is preferably an intensity that it amounts to 0.02 to 2.5 T on the average.

The curing treatment of the layer 16A of the material for conductive elastomer is suitably selected according to the material used. However, the treatment is generally conducted by a heat treatment. Specific heating temperature and heating time are suitably selected in view of the kinds of the polymeric substance-forming material forming the layer 16A of the material for conductive elastomer, and the like, the time required for movement of the conductive particles P, and the like.

The second anisotropically conductive elastomer sheet 17 may be produced in the same manner as in the first anisotropically conductive elastomer sheet 16.

According to such an anisotropically conductive connector 15, each of the rigid conductors 12 in the composite conductive sheet 10 is provided movably in the thickness-wise direction of the insulating sheet 11, so that the first anisotropically conductive elastomer sheet 16 arranged on one surface of the composite conductive sheet 10 and the second anisotropically conductive elastomer 17 sheet arranged on the other surface of the composite conductive sheet 10 are compressed and deformed interlockingly with each other by the movement of the rigid conductors 12 when pressurized in the thickness-wise direction by electrodes to be connected, and so the total of the irregularity-absorbing abilities possessed by both elastomer sheets is developed as the irregularity-absorbing ability of the anisotropically conductive connector 15. Accordingly, high irregularity-absorbing ability can be achieved.

It is only necessary to secure the thickness required to achieve necessary irregularity-absorbing ability by the total thickness of the first anisotropically conductive elastomer sheet 16 and second anisotropically conductive elastomer sheet 17, so that anisotropically conductive elastomer sheets having a small thickness may be used as the respective anisotropically conductive elastomer sheets, and so high resolving power can be achieved.

Accordingly, electrical connection to respective electrodes can be surely achieved in a state that necessary insulating property has been secured between adjacent electrodes even about an object of connection, in which a clearance between adjacent electrodes is small, and there are variations of height in the respective electrodes.

<Adaptor Device>

Figure 17:
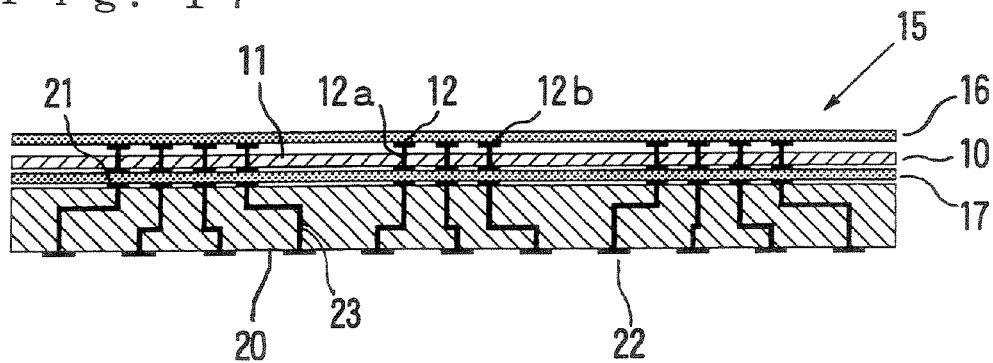
FIG. 17 is a cross-sectional view illustrating the construction of a first exemplary adaptor device according to the present invention.
Figure 18:
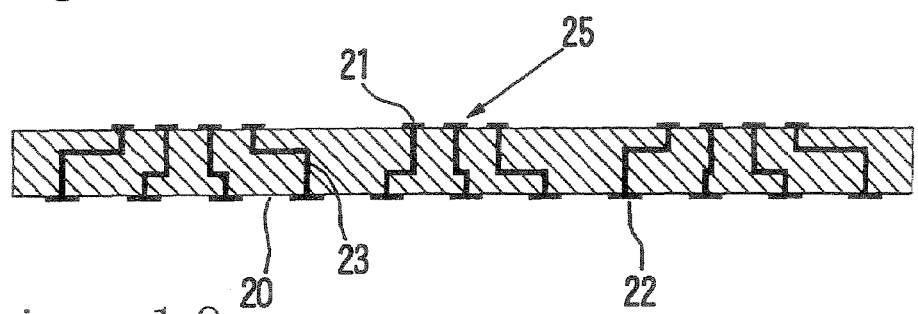
FIG. 18 is a cross-sectional view illustrating the construction of an adaptor body in the adaptor device shown in FIG. 17.

FIG. 17 is a cross-sectional view illustrating the construction of a first exemplary adaptor device according to the present invention, and FIG. 18 is a cross-sectional view illustrating an adaptor body in the adaptor device shown in FIG. 17. This adaptor device is adapted to inspection of circuit devices used in, for example, an open short-circuit test of, for example, a circuit device such as a printed circuit board and has an adaptor body 20 composed of a multi-layer wiring board.

On a front surface (upper surface in FIGS. 17 and 18) of the adaptor body 20, is formed a connecting electrode region 25, in which a plurality of connecting electrodes 21 are arranged in accordance with a specific pattern corresponding to a pattern of electrodes to be inspected of a circuit device that is an object of inspection.

On a back surface of the adaptor body 20, a plurality of terminal electrodes 22 are arranged according to positions of lattice points having a pitch of, for example, 0.8 mm, 0.75 mm, 1.5 mm, 1.8 mm or 2.54 mm, and each of the terminal electrodes 22 is electrically connected to its corresponding connecting electrode 21 through an internal wiring part 23.

On the front surface of this adaptor body 20, an anisotropically conductive connector 15 of the construction basically illustrated in FIG. 10 is arranged on its connecting electrode region 25 in such a manner that the second anisotropically conductive elastomer sheet 17 thereof comes into contact with the adaptor body 20, and is fixed to the adaptor body 20 by a proper means (not illustrated).

In this anisotropically conductive connector 15, a plurality of rigid conductors 12 are arranged in a composite conductive sheet 10 in accordance with the same pattern as the specific pattern of the connecting electrodes 21 in the adaptor body 20, and the anisotropically conductive connector 15 is arranged in such a manner that the respective rigid conductors 12 in the composite conductive sheet 10 are located right above their corresponding connecting electrodes 21 of the adaptor body 20.

According to this adaptor device, the anisotropically conductive connector 15 of the construction illustrated in FIG. 10 is provided, so that electrical connection to respective electrodes to be inspected can be surely achieved in a state that necessary insulating property has been secured between adjacent electrodes to be inspected even when a circuit device, which is an object of inspection, is small in the clearance between adjoining electrodes to be inspected, and there are variations of height in the electrodes to be inspected.

Figure 19:
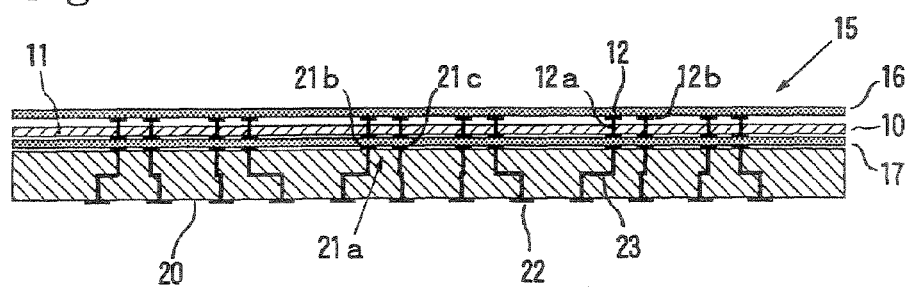
FIG. 19 is a cross-sectional view illustrating the construction of a second exemplary adaptor device according to the present invention.
Figure 20:
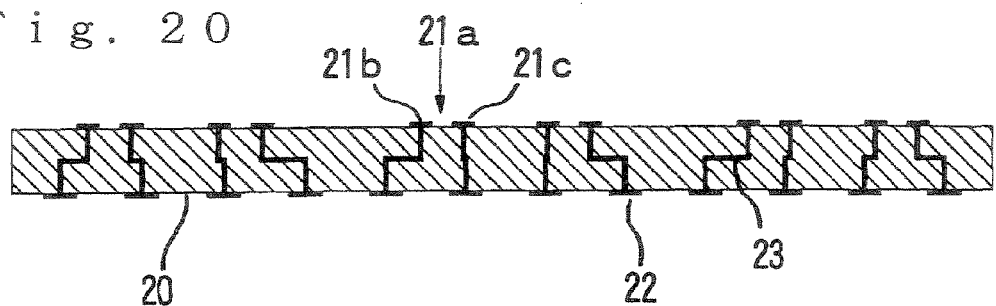
FIG. 20 is a cross-sectional view illustrating the construction of an adaptor body in the adaptor device shown in FIG. 19.

FIG. 19 is a cross-sectional view illustrating the construction of a second exemplary adaptor device according to the present invention, and FIG. 20 is a cross-sectional view illustrating an adaptor body in the adaptor device shown in FIG. 19. This adaptor device is adapted to inspection of circuit devices used in an electric resistance-measuring test of each wiring pattern as to, for example, a circuit device such as a printed circuit board and has an adaptor body 20 composed of a multi-layer wiring board.

On a front surface (upper surface in FIGS. 19 and 20) of the adaptor body 20, is formed a connecting electrode region 25, in which plural pairs 21*a* of connecting electrodes each composed of a connecting electrode (hereinafter also referred to as "electrode for current supply") 21*b* for current supply and a connecting electrode (hereinafter also referred to as "electrode for voltage measurement") 21*c* for voltage measurement, which are electrically connected to the same electrode to be inspected and separated from each other, are arranged. These pairs 21*a* of connecting electrodes are arranged in accordance with a pattern corresponding to a pattern of electrodes to be inspected in a circuit device that is an object of inspection.

On a back surface of the adaptor body 20, a plurality of terminal electrodes 22 are arranged according to positions of lattice points having a pitch of, for example, 0.8 mm, 0.75 mm, 1.5 mm, 1.8 mm or 2.54 mm.

Each of the electrode 21*b* for current supply and the electrode 21*c* for voltage measurement is electrically connected to its corresponding terminal electrode 22 through an internal wiring part 23.

On the front surface of this adaptor body 20, an anisotropically conductive connector 15 of the construction basically illustrated in FIG. 10 is arranged on its connecting electrode region 25 in such a manner that the second anisotropically conductive elastomer sheet 17 thereof comes into contact with the adaptor body 20, and is fixed to the adaptor body 20 by a proper means (not illustrated).

In this anisotropically conductive connector 15, a plurality of rigid conductors 12 are arranged in a composite conductive sheet 10 in accordance with the same pattern as the specific pattern of the connecting electrodes 21*b*, 21*c* in the adaptor body 20, and the anisotropically conductive connector 15 is arranged in such a manner that the respective rigid conductors 12 in the composite conductive sheet 10 are located right above their corresponding connecting electrodes 21*b*, 21*c* of the adaptor body 20.

According to this adaptor device, the anisotropically conductive connector 15 of the construction illustrated in FIG. 10 is provided, so that electrical connection to respective electrodes to be inspected can be surely achieved in a state that necessary insulating property has been secured between adjacent electrodes to be inspected even when a circuit device, which is an object of inspection, is small in the clearance between adjoining electrodes to be inspected, and there are variations of height in the electrodes to be inspected.

<Electrical Inspection Apparatus for Circuit Device>

Figure 21:
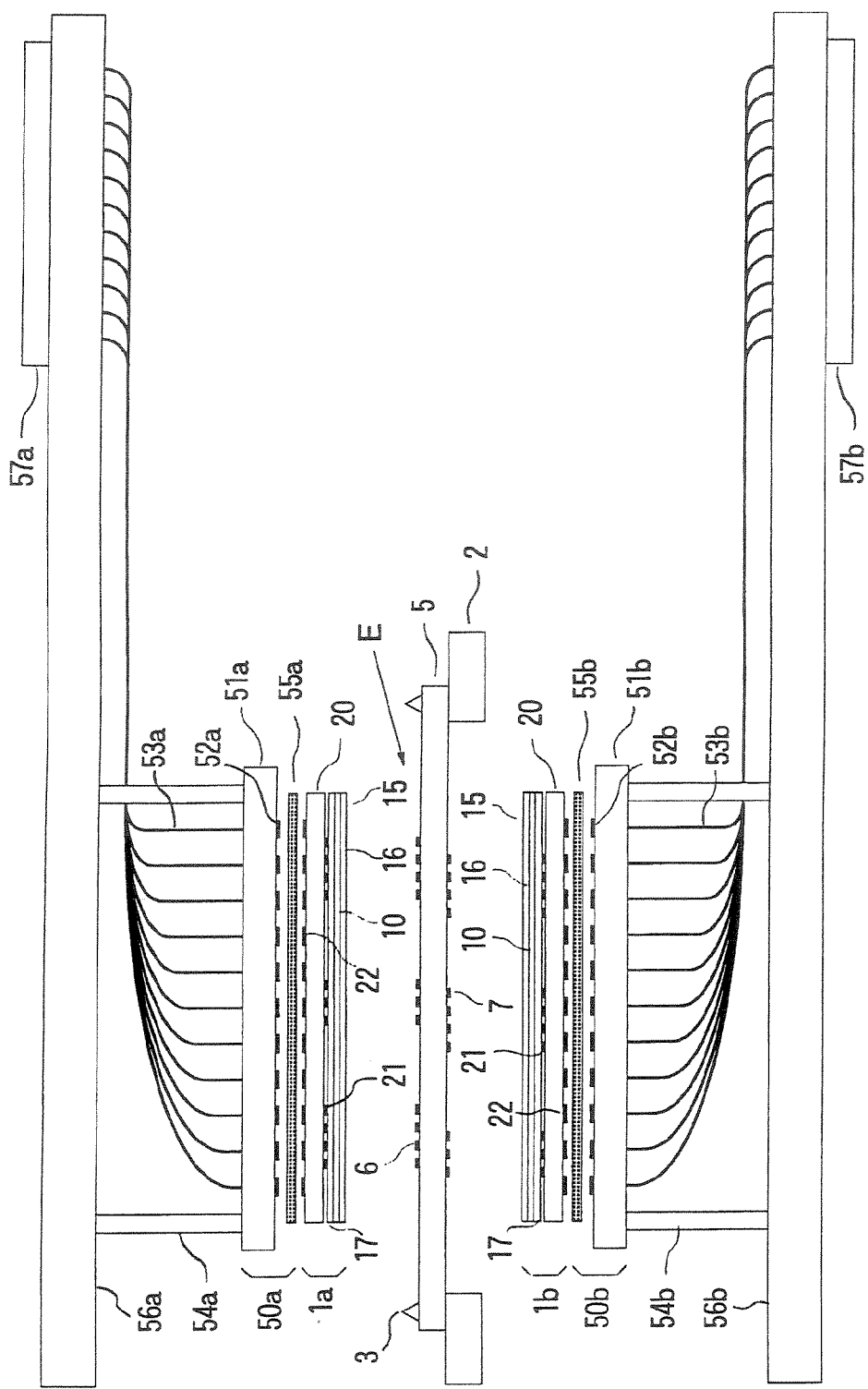
FIG. 21 illustrates the construction of a first exemplary electrical inspection apparatus for circuit devices according to the present invention.

FIG. 21 illustrates the construction of a first exemplary electrical inspection apparatus for circuit devices according to the present invention. This electrical inspection apparatus serves to conduct, for example, an open short-circuit test as to a circuit device 5 such as a printed circuit board, on both surfaces of which electrodes 6 and 7 to be inspected have been formed, and has a holder 2 for holding the circuit device 5 in an inspection-executing region E. This holder 2 is provided with positioning pins 3 for arranging the circuit device 5 at a proper position in the inspection-executing region E. Above the inspection-executing region E, an upper-side adaptor device 1*a* of such construction as shown in FIG. 17 and an upper-side inspection head 50*a* are arranged in this order from below. Above the upper-side inspection head 50*a*, an upper-side supporting plate 56*a* is arranged, and the upper-side inspection head 50*a* is fixed to an upper-side supporting plate 56*a* by supports 54*a*. On the other hand, below the inspection-executing region E, a lower-side adaptor device 1*b* of such construction as shown in FIG. 17 and a lower-side inspection head 50*b* are arranged in this order from above. Below the lower-side inspection head 50*b*, a lower-side supporting plate 56*b* is arranged, and the lower-side inspection head 50*b* is fixed to the lower-side supporting plate 56*b* by supports 54*b*.

The upper-side inspection head 50*a* is constructed by a plate-like inspection electrode device 51*a* and an anisotropically conductive elastomer sheet 55*a* arranged by being fixed to a lower surface of the inspection electrode device 51*a* and having elasticity. The inspection electrode device 51*a* has, on its lower surface, a plurality of pin-like inspection electrodes 52*a* arranged at positions of lattice points of the same pitch as terminal electrodes 22 of the upper-side adaptor device 1*a*. Each of these inspection electrodes 52*a* is electrically connected to a connector 57*a* provided on the upper-side supporting plate 56*a* through an electrical wire 53*a* and further electrically connected to an inspection circuit (not illustrated) of a tester through the connector 57*a*.

The lower-side inspection head 50*b* is constructed by a plate-like inspection electrode device 51*b* and an anisotropically conductive elastomer sheet 55*b* arranged by being fixed to an upper surface of the inspection electrode device 51*b* and having elasticity. The inspection electrode device 51*b* has, on its upper surface, a plurality of pin-like inspection electrodes 52*b* arranged at positions of lattice points of the same pitch as terminal electrodes 22 of the lower-side adaptor device 1*b*. Each of these inspection electrodes 52*b* is electrically connected to a connector 57*b* provided on the lower-side supporting plate 56*b* through an electrical wire 53*b* and further electrically connected to the inspection circuit (not illustrated) of the tester through the connector 57*b*.

The respective anisotropically conductive elastomer sheets 55*a* and 55*b* in the upper-side inspection head 50*a* and the lower-side inspection head 50*b* are such that conductive path-forming parts forming a conductive path in only the thickness-wise direction thereof are formed. As such anisotropically conductive elastomer sheets 55*a*, 55*b*, are preferred those, in which each conductive path-forming part is formed so as to protrude in the thickness-wise direction on at least one surface in that high electrical contact stability is exhibited.

In such an electrical inspection apparatus for circuit devices, the circuit device 5, which is the object of inspection, is held in the inspection-executing region E by the holder 2. In this state, the upper-side supporting plate 56*a* and the lower-side supporting plate 56*b* are moved in respective directions approaching the circuit device 5, thereby pinching the circuit device 5 by the upper-side adaptor device 1*a* and the lower-side adaptor device 1*b*.

In this state, the electrodes 6 to be inspected on the upper surface of the circuit device 5 are electrically connected to the respective connecting electrodes 21 in the upper-side adaptor device 1*a* through the anisotropically conductive connector 10, and the terminal electrodes 22 of the upper-side adaptor device 1*a* are electrically connected to the respective inspection electrodes 52*a* of the inspection electrode device 51*a* through the anisotropically conductive elastomer sheet 55*a*. On the other hand, the electrodes 7 to be inspected on the lower surface of the circuit device 5 are electrically connected to the respective connecting electrodes 21 in the lower-side adaptor device 1*b* through the anisotropically conductive connector 10, and the terminal electrodes 22 of the lower-side adaptor device 1*b* are electrically connected to the respective inspection electrodes 52*b* of the inspection electrode device 51*b* through the anisotropically conductive elastomer sheet 55*b*.

In such a manner, the electrodes 6, 7 to be inspected on both upper and lower surfaces of the circuit device 5 are electrically connected to the inspection electrodes 52a of the inspection electrode device 51a in the upper-side inspection head 50a and the inspection electrodes 52b of the inspection electrode device 51b in the lower-side inspection head 50b, respectively, whereby a state electrically connected to the inspection circuit of the tester is achieved. In this state, necessary electrical inspection is conducted.

According to the above-described electrical inspection apparatus for circuit devices, the upper-side adaptor device 1a and lower-side adaptor device 1b of such construction as shown in FIG. 17 are provided, so that necessary electrical inspection on the circuit device 5, which is the object of inspection, can be surely performed even when the circuit device is small in the clearance between adjoining electrodes 6, 7 to be inspected, and there are variations of height in electrodes 6, 7 to be inspected.

Figure 22:
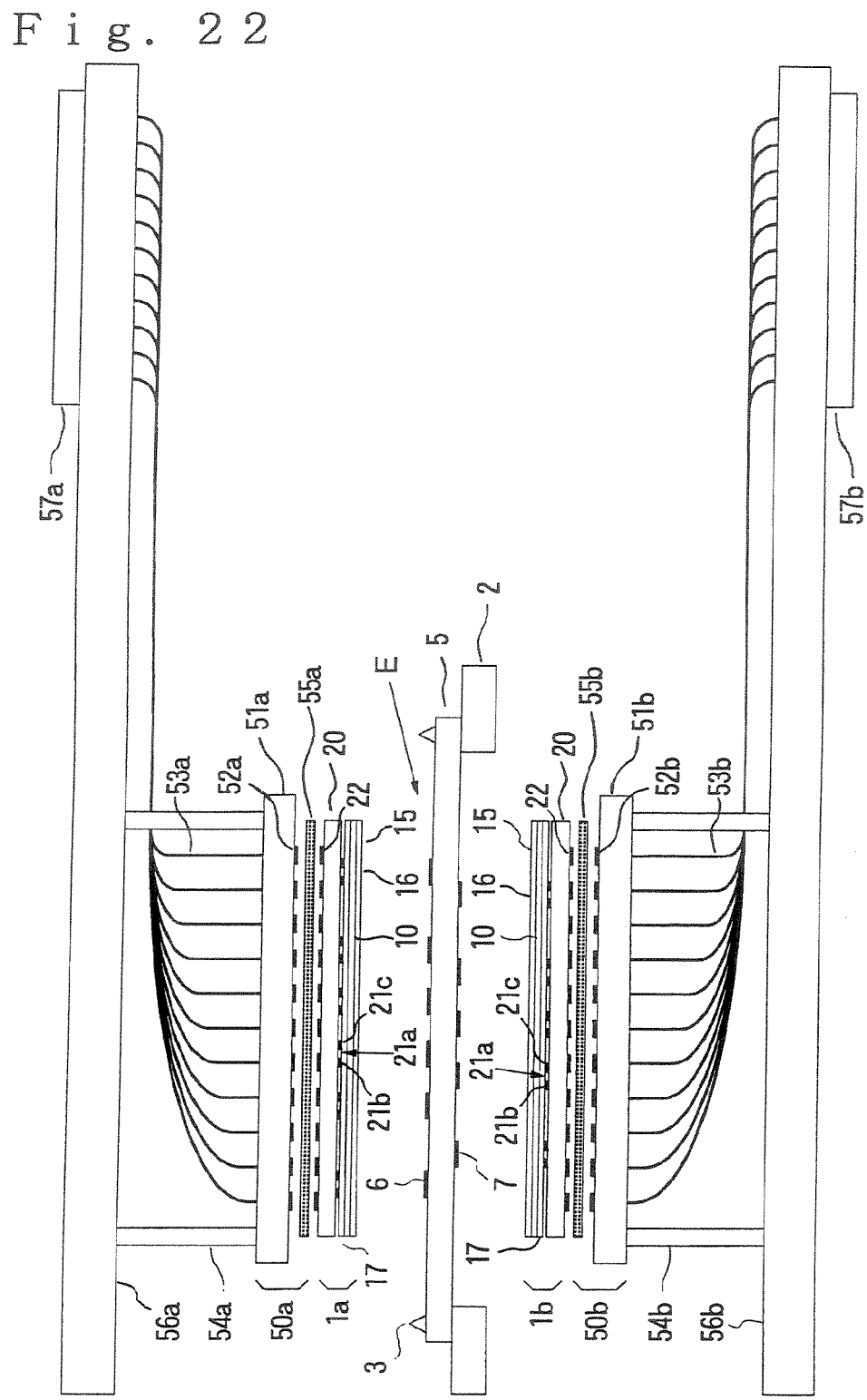
FIG. 22 illustrates the construction of a second exemplary electrical inspection apparatus for circuit devices according to the present invention.

FIG. 22 illustrates the construction of a second exemplary electrical inspection apparatus for circuit devices according to the present invention. This electrical inspection apparatus serves to conduct an electric resistance-measuring test of each wiring pattern as to a circuit device 5 such as a printed circuit board, on both surfaces of which electrodes 6 and 7 to be inspected have been formed, and has a holder 2 for holding the circuit device 5 in an inspection-executing region E. This holder 2 is provided with positioning pins 3 for arranging the circuit device 5 at a proper position in the inspection-executing region E.

Above the inspection-executing region E, an upper-side adaptor device 1a of such construction as shown in FIG. 19 and an upper-side inspection head 50a are arranged in this order from below. Above the upper-side inspection head 50a, an upper-side supporting plate 56a is arranged, and the upper-side inspection head 50a is fixed to the upper-side supporting plate 56a by supports 54a. On the other hand, below the inspection-executing region E, a lower-side adaptor device 1b of such construction as shown in FIG. 19 and a lower-side inspection head 50b are arranged in this order from above. Below the lower-side inspection head 50b, a lower-side supporting plate 56b is arranged, and the lower-side inspection head 50b is fixed to the lower-side supporting plate 56b by supports 54b.

The upper-side inspection head 50a is constructed by a plate-like inspection electrode device 51a and an anisotropically conductive elastomer sheet 55a arranged by being fixed to a lower surface of the inspection electrode device 51a and having elasticity. The inspection electrode device 51a has, on its lower surface, a plurality of pin-like inspection electrodes 52a arranged at positions of lattice points of the same pitch as terminal electrodes 22 of the upper-side adaptor device 1a. Each of these inspection electrodes 52a is electrically connected to a connector 57a provided on the upper-side supporting plate 56a through an electrical wire 53a and further electrically connected to an inspection circuit (not illustrated) of a tester through the connector 57a.

The lower-side inspection head 50b is constructed by a plate-like inspection electrode device 51b and an anisotropically conductive elastomer sheet 55b arranged by being fixed to an upper surface of the inspection electrode device 51b and having elasticity. The inspection electrode device 51b has, on its upper surface, a plurality of pin-like inspection electrodes 52b arranged at positions of lattice points of the same pitch as terminal electrodes 22 of the lower-side adaptor device 1b. Each of these inspection electrodes 52b is electrically connected to a connector 57b provided on the lower-side supporting plate 56b through an electrical wire 53b and further electrically connected to the inspection circuit (not illustrated) of the tester through the connector 57b.

The respective anisotropically conductive elastomer sheets 55a and 55b in the upper-side inspection head 50a and the lower-side inspection head 50b basically have the same construction as in the first exemplary electrical inspection apparatus.

In such an electrical inspection apparatus for circuit devices, the circuit device 5, which is the object of inspection, is held in the inspection-executing region E by the holder 2. In this state, the upper-side supporting plate 56a and the lower-side supporting plate 56b are moved in respective directions approaching the circuit device 5, thereby pinching the circuit device 5 by the upper-side adaptor device 1a and the lower-side adaptor device 1b.

In this state, each of the electrodes 6 to be inspected on the upper surface of the circuit device 5 is electrically connected to both connecting electrode 21b for current supply and connecting electrode 21c for voltage measurement of the connecting electrode pair 21a in the upper-side adaptor device 1a through the anisotropically conductive connector 15, and the terminal electrodes 22 of the upper-side adaptor device 1a are electrically connected to the respective inspection electrodes 52a of the inspection electrode device 51a through the anisotropically conductive elastomer sheet 55a. On the other hand, each of the electrodes 7 to be inspected on the lower surface of the circuit device 5 is electrically connected to both connecting electrode 21b for current supply and connecting electrode 21c for voltage measurement of the connecting electrode pair 21a in the lower-side adaptor device 1b through the anisotropically conductive connector 15, and the terminal electrodes 22 of the lower-side adaptor device 1b are electrically connected to the respective inspection electrodes 52b of the inspection electrode device 51b through the anisotropically conductive elastomer sheet 55b.

In such a manner, the electrodes 6, 7 to be inspected on both upper and lower surfaces of the circuit device 5 are electrically connected to the inspection electrodes 52a of the inspection electrode device 51a in the upper-side inspection head 50a and the inspection electrodes 52b of the inspection electrode device 51b in the lower-side inspection head 50b, respectively, whereby a state electrically connected to the inspection circuit of the tester is achieved. In this state, necessary electrical inspection is conducted. Specifically, a current of a constant value is supplied between the electrode 21b for current supply in the upper-side adaptor device 1a and the electrode 21b for current supply in the lower-side adaptor device 1b, and one electrode is designated among the plurality of the electrodes 21c for voltage measurement in the upper-side adaptor device 1a, a voltage between the designated one electrode 21c for voltage measurement in the upper-side adaptor device 1a and an electrode 21c for voltage measurement in the lower-side adaptor device 1b, which is electrically connected to a lower-side electrode 6 to be inspected corresponding to an upper-side electrode 5 to be inspected electrically connected to the designated electrode 21c for voltage measurement, is measured, thereby gaining an electric resistance value of a wiring pattern formed between the upper-side electrode 5 to be inspected electrically connected to the designated one electrode 21c for voltage measurement and its corresponding other-side electrode 6 to be inspected on the basis of the voltage value thus obtained. Measurement of electric resistances on all wiring patterns is conducted by successively changing an electrode 21c for voltage measurement to be designated.

According to the above-described electrical inspection apparatus for circuit devices, the upper-side adaptor device 1a and lower-side adaptor device 1b of such construction as shown in FIG. 19 are provided, so that necessary electrical inspection on the circuit device 5, which is the object of inspection, can be surely performed even when the circuit device 5 is small in the clearance between adjoining electrodes 6, 7 to be inspected, and there are variations of height in electrodes 6, 7 to be inspected.

Figure 23:
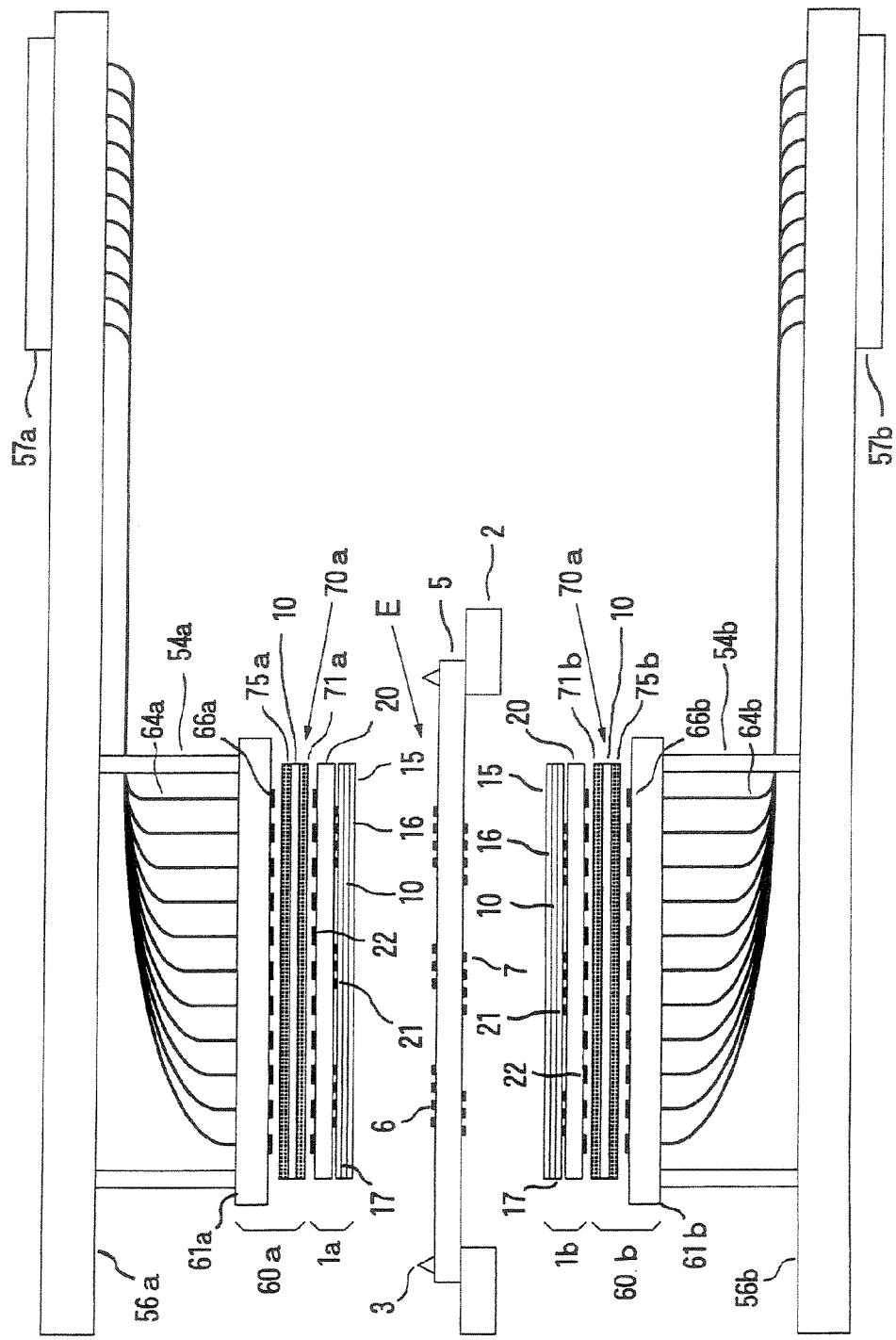
FIG. 23 illustrates the construction of a third exemplary electrical inspection apparatus for circuit devices according to the present invention.

FIG. 23 illustrates the construction of a third exemplary electrical inspection apparatus for circuit devices according to the present invention. This electrical inspection apparatus serves to conduct, for example, an open short-circuit test as to a circuit device 5 such as a printed circuit board, on both surfaces of which electrodes 6 and 7 to be inspected have been formed, and has a holder 2 for holding the circuit device 5 in an inspection-executing region E. This holder 2 is provided with positioning pins 3 for arranging the circuit device 5 at a proper position in the inspection-executing region E. Above the inspection-executing region E, an upper-side adaptor device 1a of such construction as shown in FIG. 17 and an upper-side inspection head 60a are arranged in this order from below. Above the upper-side inspection head 60a, an upper-side supporting plate 56a is arranged, and the upper-side inspection head 60a is fixed to the upper-side supporting plate 56a by supports 54a. On the other hand, below the inspection-executing region E, a lower-side adaptor device 1b of such construction as shown in FIG. 17 and a lower-side inspection head 60b are arranged in this order from above. Below the lower-side inspection head 60b, a lower-side supporting plate 56b is arranged, and the lower-side inspection head 60b is fixed to the lower-side supporting plate 56b by supports 54b.

The upper-side inspection head 60a is constructed by a plate-like inspection electrode device 61a and an anisotropically conductive connector 70a arranged by being fixed to a lower surface of the inspection electrode device 61a.

On the other hand, the lower-side inspection head 60b is constructed by a plate-like inspection electrode device 61b and an anisotropically conductive connector 70b arranged by being fixed to an upper surface of the inspection electrode device 61b and having elasticity.

Figure 24:
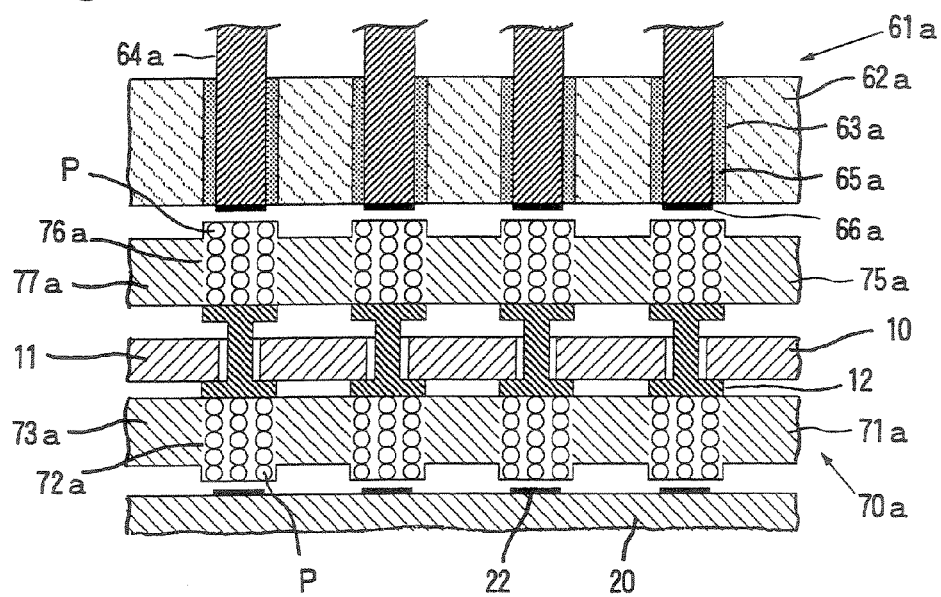
FIG. 24 is a cross-sectional view illustrating, on an enlarged scale, the construction of a principal part of an upper-side inspection head in the electrical inspection apparatus for circuit devices shown in FIG. 23.

As illustrated on an enlarged scale in FIG. 24, the inspection electrode device 61a in the upper-side inspection head 60a has a flat plate-like insulating substrate 62a, in which a plurality of through-holes 63a each extending in a thickness-wise direction of the substrate have been formed according to positions of lattice points of the same pitch as terminal electrodes 22 of an adaptor body 20 in the upper-side adaptor device. An electrical wire 64a is arranged by being inserted into each of the through-holes 63a in this insulating substrate 62a in such a manner that the tip surface thereof is located at the same level as the surface of the insulating substrate 62a, and a fixing member 65a composed of, for example, a cured product of a liquid sealant is formed between an inner wall surface of each through-holes 63a in the insulating substrate 62a and an outer peripheral surface of each electrical wire 64a for fixing the electrical wire 64a. A circular filmy inspection electrode 66a is formed on the tip surface of each electrical wire 64a. Each of these inspection electrodes 66a is electrically connected to a connector 57a provided on an upper-side supporting plate 56a through the electrical wire 64a and further electrically connected to an inspection circuit (not illustrated) of a tester through the connector 57a.

As a material for forming the insulating substrate 62a, may be preferably used an insulating material having a resistivity of, for example, at least $1 \times 10^{16}$ Ω·cm. As specific examples thereof, may be mentioned resin materials having high mechanical strength, such as polyimide resins, polyester resins, polyamide resins, phenol resins, polyacetal resins, poly (butylene terephthalate) resins, poly(ethylene terephthalate) resins, syndiotactic polystyrene resins, poly(phenylene sulfide) resins, poly(ether ethyl ketone) resins, fluorocarbon resins, poly(ether nitrile) resins, poly(ether sulfone) resins, polyarylate resins and polyamide-imide resins; glass fiber composite resin materials such as glass fiber-reinforced epoxy resins, glass fiber-reinforced polyester resins, glass fiber-reinforced polyimide resins, glass fiber-reinforced phenol resins and glass fiber-reinforced fluorocarbon resins; carbon fiber composite resins such as carbon fiber-reinforced epoxy resins, carbon fiber-reinforced polyester resins, carbon fiber-reinforced polyimide resins, carbon fiber-reinforced phenol resins and carbon fiber-reinforced fluorocarbon resins; composite resin materials with an inorganic material such as silica, alumina or boron nitride filled into an epoxy resin, phenol resin or the like; and composite resin materials with a mesh contained in an epoxy resin, phenol resin or the like. Composite plate materials formed by laminating a plurality of plate materials composed of these materials may also be used.

The thickness of the insulating substrate 62a is, for example, preferably 5 mm or small, more preferably 2 to 5 mm in that the through-holes 63a can be easily formed by, for example, drill machining.

The opening diameter of the through-holes 63a in the insulating substrate 62a is suitably preset in view of the pitch of the through-holes 63a and the diameter of the electrical wires 64a. For example, when the diameter of the electrical wires 64a is 200 μm, the diameter of the through-holes 63a is 0.25 to 0.35 mm.

As the electrical wires 64a, may be used those suitably used in the past, such as enameled wires or nichrome wires. The diameter of the electrical wires is, for example, 50 to 400 μm.

As the liquid sealant for forming the fixing member 65a, is used that having sufficiently high adhesive property to the insulating substrate 62a. As specific examples thereof, may be mentioned epoxy resin sealants, polyimide resin sealants and polyamide resin sealants.

As a material for forming the inspection electrodes 66a, may be used copper, nickel, gold or an alloy thereof. The inspection electrodes 66a may be formed by a laminate of these metals.

The diameter of the inspection electrodes 66a is suitably preset according to the diameter of the electrical wires 64a and the diameter of the terminal electrodes 22 of the adaptor body 20 in the upper-side adaptor device. The thickness of the inspection electrodes 66a is, for example, 0.1 to 20 μm.

The inspection electrode device 61a of such construction can be produced, for example, in the following manner.

Figure 25:
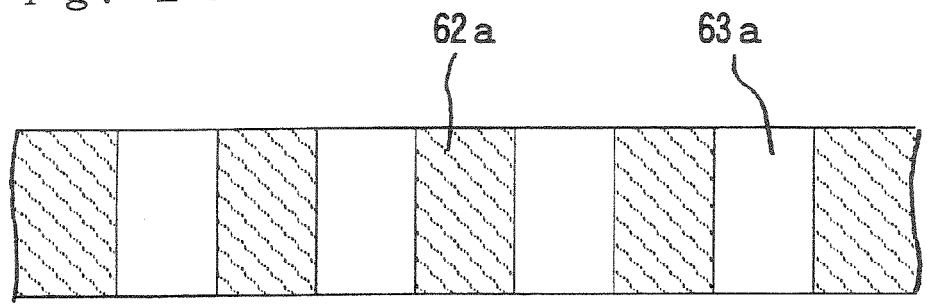
FIG. 25 is a cross-sectional view illustrating the construction of an insulating substrate.

A flat plate-like insulating substrate-forming material is first provided, and the insulating substrate-forming material is subjected to, for example, drill machining, thereby producing an insulating substrate 62a, in which a plurality of through-holes 63a each extending in a thickness-wise direction of the substrate have been formed at positions of lattice points of the same pitch as the terminal electrodes 22 of the adaptor body 20 in the upper-side adaptor device 1a, as illustrated in FIG. 25.

Figure 26:
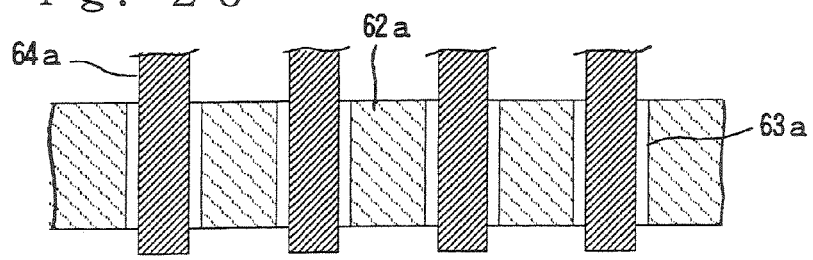
FIG. 26 is a cross-sectional view illustrating a state that an electrical wire has been inserted into each of through-holes in the insulating substrate.
Figure 27:
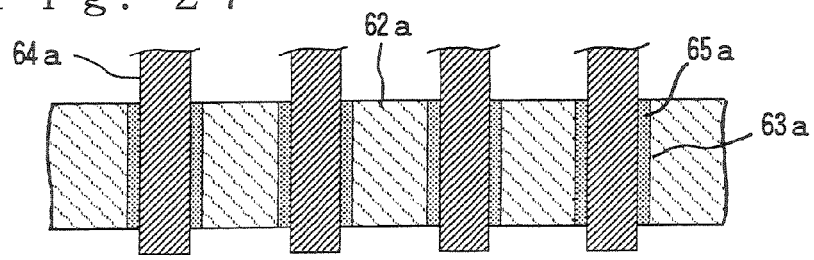
FIG. 27 is a cross-sectional view illustrating a state that a fixing member has been formed between an inner wall surface of each through-hole in the insulating substrate and an outer peripheral surface of the electrical wire.

Thereafter, an electrical wire 64a is inserted into each of the through-holes 63a in the insulating substrate 62a in such a manner that the tip surface thereof protrudes from the surface of the insulating substrate 62a as illustrated in FIG. 26. In this state, a liquid sealant is poured into the through-holes 63a in the insulating substrate 62a and cured, thereby forming a fixing member 65a between an inner wall surface of each through-holes 63a in the insulating substrate 62a and an outer peripheral surface of the electrical wire 64a as illustrated in FIG. 27.

Figure 28:
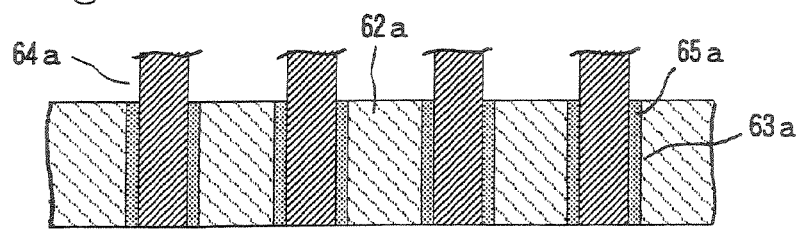
FIG. 28 is a cross-sectional view illustrating a state that the tip portion of each electrical wire has been polished.

The tip surface of each of the electrical wires 64a is then polished to the same level as the surface of the insulating substrate 62a as illustrated in FIG. 28.

Figure 29:
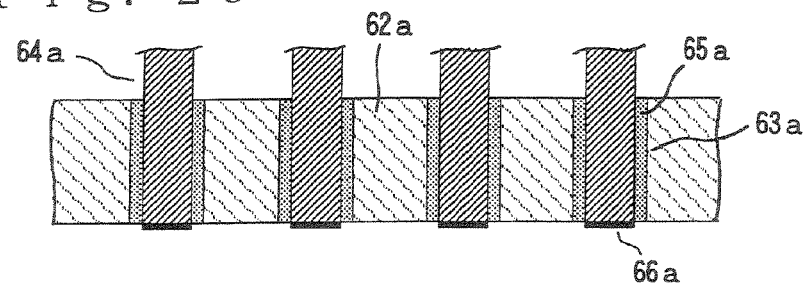
FIG. 29 is a cross-sectional view illustrating a state that an inspection electrode has been formed on the tip surface of each electrical wire.

The tip surface of each of the electrical wires 64a is then subjected to an electroplating treatment, thereby forming a filmy inspection electrode 66a as illustrated in FIG. 29, thus obtaining the inspection electrode device 61a.

The anisotropically conductive connector 70a in the upper-side inspection head 60a is constructed by a composite conductive sheet 10 of basically the same construction as the composite conductive sheet 10 shown in FIG. 1 except for the arrangement pattern of the rigid conductors 12 and the dimensions of the respective members, a first anisotropically conductive elastomer sheet 71a arranged on one surface of this composite conductive sheet 10 and a second anisotropically conductive elastomer sheet 75a arranged on the other surface of the composite conductive sheet 10.

The first anisotropically conductive elastomer sheet 71a and second anisotropically conductive elastomer sheet 75a are respectively constructed by a plurality of conductive path-forming parts 72a and 76a arranged according to positions of lattice points of the same pitch as the terminal electrodes 22 of the upper-side adaptor device 1a and each extending in the thickness-wise direction of the sheet, and insulating parts 73a and 77a mutually insulating them. Each of the conductive path-forming parts 72a, 76a contains conductive particles P exhibiting magnetism in a state oriented in an insulating elastic polymeric substance so as to align in the thickness-wise direction to form a chain. On the other hand, the insulating parts 73a, 77a are each formed of the elastic polymeric substance and do not contain the conductive particles at all or scarcely contain them. In the illustrated embodiment, each of the conductive path-forming parts 72a and 76a in the first anisotropically conductive elastomer sheet 71a and second anisotropically conductive elastomer sheet 75a is formed so as to protrude in the thickness-wise direction from one surface of the sheet. On the other hand, the other surface of each of the conductive path-forming parts forms a flat surface with the other surface of each of the first anisotropically conductive elastomer sheet 71a and second anisotropically conductive elastomer sheet 75a. Each of the first anisotropically conductive elastomer sheet 71a and second anisotropically conductive elastomer sheet 75a is arranged in such a manner that the other surface, which is a flat surface, comes into contact with the composite conductive sheet 10. Such an anisotropically conductive elastomer sheet can be produced by a conventionally known process.

Figure 30:
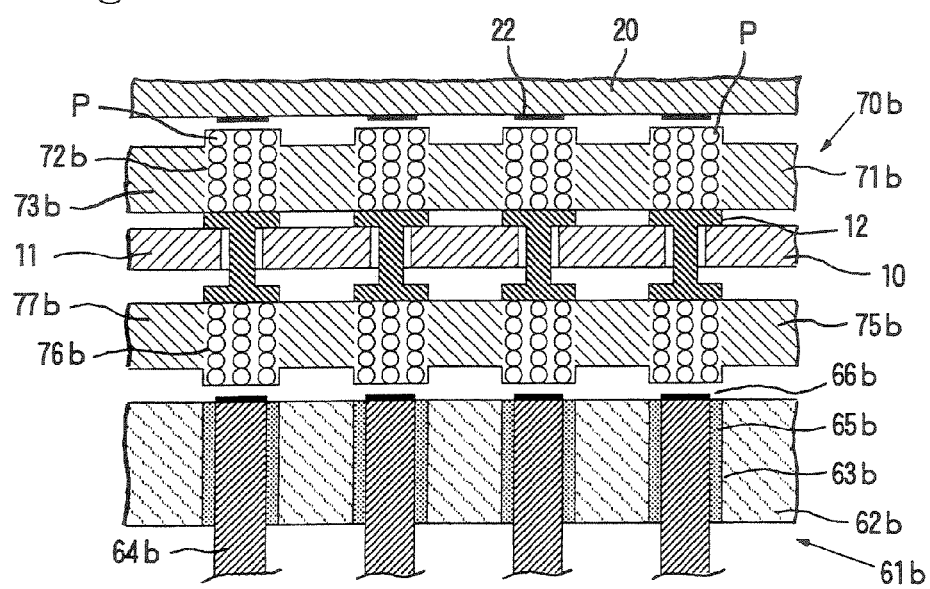
FIG. 30 is a cross-sectional view illustrating, on an enlarged scale, the construction of a principal part of a lower-side inspection head in the electrical inspection apparatus for circuit devices shown in FIG. 23.

As illustrated on an enlarged scale in FIG. 30, the inspection electrode device 61b in the lower-side inspection head 60b has a flat plate-like insulating substrate 62b, in which a plurality of through-holes 63b each extending in a thickness-wise direction of the substrate have been formed according to positions of lattice points of the same pitch as terminal electrodes 22 of the lower-side adaptor device 1b. An electrical wire 64b is arranged by being inserted into each of the through-holes 63b in this insulating substrate 62b in such a manner that the tip surface thereof is located at the same level as the surface of the insulating substrate 62b, and a fixing member 65b composed of, for example, a cured product of a liquid sealant is formed between an inner wall surface of each through-holes 63b in the insulating substrate 62b and an outer peripheral surface of each electrical wire 64b for fixing the electrical wire 64b. A circular filmy inspection electrode 66b is formed on the tip surface of each electrical wire 64b. Each of these inspection electrodes 66b is electrically connected to a connector 57b provided on a lower-side supporting plate 56b through the electrical wire 64b and further electrically connected to an inspection circuit (not illustrated) of a tester through the connector 57b. Other specific constructions in the inspection electrode device 61b are the same as those of the inspection electrode device 61a in the upper-side inspection head 60a.

The anisotropically conductive connector 70b in the lower-side inspection head 60b is constructed by a composite conductive sheet 10 of basically the same construction as the composite conductive sheet 10 shown in FIG. 1 except for the arrangement pattern of the rigid conductors 12 and the dimensions of the respective members, a first anisotropically conductive elastomer sheet 71b arranged on one surface of this composite conductive sheet 10 and a second anisotropically conductive elastomer sheet 75b arranged on the other surface of the composite conductive sheet 10.

The first anisotropically conductive elastomer sheet 71b and second anisotropically conductive elastomer sheet 75b are respectively constructed by a plurality of conductive path-forming parts 72b and 76b arranged according to positions of lattice points of the same pitch as the terminal electrodes 22 of the lower-side adaptor device 1b and each extending in the thickness-wise direction of the sheet, and insulating parts 73b and 77b mutually insulating them. Each of the conductive path-forming parts 72b, 76b contains conductive particles P exhibiting magnetism in a state oriented in an insulating elastic polymeric substance so as to align in the thickness-wise direction to form a chain. On the other hand, the insulating parts 73b, 77b are each formed of the elastic polymeric substance and do not contain the conductive particles at all or scarcely contain them. In the illustrated embodiment, each of the conductive path-forming parts 72b and 76b in the first anisotropically conductive elastomer sheet 71b and second anisotropically conductive elastomer sheet 75b is formed so as to protrude in the thickness-wise direction from one surface of the sheet. On the other hand, the other surface of each of the conductive path-forming parts forms a flat surface with the other surface of each of the first anisotropically conductive elastomer sheet 71b and second anisotropically conductive elastomer sheet 75b. Each of the first anisotropically conductive elastomer sheet 71b and second anisotropically conductive elastomer sheet 75b is arranged in such a manner that the other surface, which is a flat surface, comes into contact with the composite conductive sheet 10. Such an anisotropically conductive elastomer sheet can be produced by a conventionally known process.

In such an electrical inspection apparatus for circuit devices, the circuit device 5, which is the object of inspection, is held in the inspection-executing region E by the holder 2. In this state, the upper-side supporting plate 56a and the lower-side supporting plate 56b are moved in respective directions approaching the circuit device 5, thereby pinching the circuit device 5 by the upper-side adaptor device 1a and the lower-side adaptor device 1b.

In this state, the electrodes 6 to be inspected on the upper surface of the circuit device 5 are electrically connected to the respective connecting electrodes 21 in the upper-side adaptor device 1a through the anisotropically conductive connector 15, and the terminal electrodes 22 of the upper-side adaptor device 1a are electrically connected to the respective inspection electrodes 66a of the inspection electrode device 61a through the anisotropically conductive connector 70a. On the other hand, the electrodes 7 to be inspected on the lower surface of the circuit device 5 are electrically connected to the respective connecting electrodes 21 in the lower-side adaptor device 1b through the anisotropically conductive connector 15, and the terminal electrodes 22 of the lower-side adaptor device 1b are electrically connected to the respective inspection electrodes 66b of the inspection electrode device 61b through the anisotropically conductive connector 70b.

In such a manner, the electrodes 6, 7 to be inspected on both upper and lower surfaces of the circuit device 5 are electrically connected to the inspection electrodes 66a of the inspection electrode device 61a in the upper-side inspection head 60a and the inspection electrodes 66b of the inspection electrode device 61b in the lower-side inspection head 60b, respectively, whereby a state electrically connected to the inspection circuit of the tester is achieved. In this state, necessary electrical inspection is conducted.

According to the above-described electrical inspection apparatus for circuit devices, the upper-side adaptor device 1a and lower-side adaptor device 1b of such construction as shown in FIG. 17 are provided, so that necessary electrical inspection on the circuit device 5, which is the object of inspection, can be surely performed even when the circuit device 5 is small in the clearance between adjoining electrodes 6, 7 to be inspected, and there are variations of height in electrodes 6, 7 to be inspected.

The present invention is not limited to the above-described embodiments, and various changes or modifications may be added thereto.

In the composite conductive sheet 10, the material for forming the rigid conductors 12 is not limited to the metallic materials so far as it is a conductor having rigidity. For example, a material obtained by containing conductive powder such as a metal in a rigid resin may be used.

In the production process of the composite conductive sheet 10, the laminate material and composite laminate material may also be those obtained by forming a metal layer on both surfaces of an insulating sheet.

In the anisotropically conductive connector 15, an uneven distribution type anisotropically conductive elastomer sheet may be used as any one or both of the first anisotropically conductive elastomer sheet and second anisotropically conductive elastomer sheet.

In the electrical inspection apparatus, the circuit device that is the object of inspection is not limited to printed circuit boards, and it may be a semiconductor integrated circuit device such as packaged IC or MCM.

EXAMPLES

The specific Examples of the present invention will hereinafter be described. However, the present invention is not limited to the following Examples.

<Production of Circuit Device for Evaluation>

A circuit device for evaluation of the following specification was produced.

Specifically, this circuit device for evaluation has dimensions of 200 mm (length)×140 mm (breadth)×0.8 mm (thickness), and upper-side electrodes to be inspected and lower-side electrodes to be inspected are each composed of a solder bump. The total number of the upper-side electrodes to be inspected is 2,400, and each electrode has a diameter of about 200 $\mu$m and a projected height of about 50 $\mu$m. A minimum pitch between the electrodes is 400 $\mu$m. The total number of the lower-side electrodes to be inspected is 2,400, and the electrodes are formed on the same pattern as the upper-side electrodes to be inspected. Each electrode has a diameter of about 150 $\mu$m and a projected height of about 50 $\mu$m. A minimum pitch between the electrodes is 400 $\mu$m. The upper-side electrodes to be inspected and the lower-side electrodes to be inspected are electrically connected to each other in relation of one to one through an internal wiring.

Example 1

An upper-side adaptor device and a lower-side adaptor device for conducting electrical inspection of the above-described circuit device for evaluation were produced in the following manner to construct an inspection apparatus for circuit devices shown in FIG. 22.

[Upper-side Adaptor Device]

(1) Production of Composite Conductive Sheet:

A laminate material ("Espanex LC18-50-00NE", product of Nippon Steel Chemical Co., Ltd.) obtained by integrally laminating a metal layer composed of copper and having a thickness of 18 $\mu$m on one surface of an insulating sheet composed of a liquid crystal polymer and having a thickness of 50 $\mu$m was provided, and a dry film resist was laminated on the metal layer in this laminate material, thereby forming a resist film.

The thus-formed resist film was then subjected to an exposure treatment and a development treatment, whereby circular pattern holes having a diameter of 40 $\mu$m were formed in the resist film according to a pattern corresponding to the upper-side electrodes to be inspected in the above-described circuit device for evaluation, an etching treatment was then conducted, whereby openings of the same pattern as the pattern holes in the resist film were formed in the metal layer, and the resist film was then removed.

Thereafter, the insulating sheet in the laminate material was subjected to laser beam machining through the openings formed in the metal layer by means of a $CO_2$ laser beam machine, thereby forming through-holes respectively linked to the openings in the metal layer.

The inner wall surfaces of the through-holes in the insulating sheet were subjected to an electroless plating treatment with copper, and additionally to an electroplating treatment with copper using the metal layer as a common electrode, whereby cylindrical thin metal layers composed of copper and having a thickness of 5 $\mu$m were formed so as to cover the inner wall surfaces of the through-holes in the insulating sheet and the opening edges of the metal layer, thus producing a composite laminate material. In this process, the diameter of the through-holes after the thin metal layers were formed was about 30 $\mu$m.

Dry film resists having a thickness of 25 $\mu$m were then laminated on both surfaces (the surface of the metal layer formed one surface of the insulating sheet and the other surface of the insulating sheet) of the composite laminate material, and an exposure treatment and a development treatment were conducted, thereby forming resist films, in which circular pattern holes having a diameter of 50 $\mu$m were formed according to a pattern corresponding to a pattern of terminal portions in rigid conductors to be formed. Thereafter, a plating solution with nickel sulfamate dissolved therein was used to conduct an electroplating treatment using the metal layer as a common electrode, thereby forming rigid conductors composed of nickel.

The surfaces of the terminal portions of the rigid conductors were polished, whereby the surfaces of the terminal portions of the rigid conductors were smoothened, and at the same time the thickness of the terminal portions was caused to conform to the thickness of the resist film. After the resist films were then removed from both surfaces of the composite laminate material, the composite laminate material was subjected to an etching treatment at 60° C. for 3 hours using an etchant with ferric chloride dissolved therein, thereby removing the metal layer and the thin metal layers, thus producing a composite conductive sheet.

The thus-obtained composite conductive sheet will be described. With respect to the insulating sheet, the material thereof is a liquid crystal polymer, and the dimensions thereof are 190 mm in length, 130 mm in breadth and 50 μm in thickness d. The diameter r1 of the through-holes is 40 μm. With respect to the rigid conductors, the total number thereof is 2,400, the diameter r2 of each body portion is 30 μm, the diameter r3 of each terminal portion is 50 μm, the length L of the body portion is 73 μm, and the movable distance (L−d) of the rigid conductor is 23 μm.

(2) Production of Anisotropically Conductive Elastomer Sheet:

After 400 parts by weight of conductive particles having a number average particle diameter of 12 μm were added and mixed into 100 parts by weight of addition type liquid silicone rubber, the resultant mixture was subjected to a defoaming treatment by pressure reduction, thereby preparing a material for conductive elastomer.

In the above-described process, those (average coating amount: 2% by weight of the weight of core particles) obtained by using nickel particles as core particles and subjecting the core particles to electroless plating with gold were used as the conductive particles.

After a frame-like spacer having a thickness of 50 μm and a rectangular opening of 120 mm×120 mm in dimensions was arranged on a molding surface of an other surface-side molding member, the material for conductive elastomer prepared above was applied into the opening of the spacer, and a one surface-side molding member was arranged on the material for conductive elastomer in such a manner that the molding surface thereof comes into contact with the material for conductive elastomer.

In the above-described process, polyester resin sheets having a thickness of 0.1 mm were used as the one surface-side molding member and the other surface-side molding member.

Thereafter, a press roll device composed of a press roll and a supporting roll was used to pinch the material for conductive elastomer by the one surface-side molding member and the other surface-side molding member, thereby forming a layer of the material for conductive elastomer having a thickness of 30 μm between the one surface-side molding member and the other surface-side molding member.

The layer of the material for conductive elastomer was then subjected to a curing treatment under conditions of 120° C. for 0.5 hours while applying a magnetic field of 0.3 T to the layer of the material for conductive elastomer in a thickness-wise direction thereof by electromagnets arranged on the respective back surfaces of the one surface-side molding member and the other surface-side molding member, thereby producing a rectangular anisotropically conductive elastomer sheet having a thickness of 30 μm.

In the above-described manner, two dispersion type anisotropically conductive elastomer sheets were produced, one of them was arranged as a first anisotropically conductive elastomer sheet on one surface of the composite conductive sheet, and the other sheet was arranged as a second anisotropically conductive elastomer sheet on the other surface of the composite conductive sheet, thereby producing an anisotropically conductive connector for an upper-side adaptor device.

(3) Production of Adaptor Body:

An adaptor body of the following specification was produced in accordance with the construction shown in FIG. 19.

Specifically, this adaptor body has dimensions of 200 mm in length and 140 mm in breadth, a material of its base plate is a glass fiber-reinforced epoxy resin, 2,400 pairs of connecting electrodes, in each of which an electrode for current supply and an electrode for voltage measurement are each in the form of a rectangle having dimensions of 120 μm×60 μm and arranged at a clearance of 60 μm (center distance of 120 μm), are arranged in a connecting electrode region on the front surface of the adaptor body according to a pattern corresponding to a pattern of the upper surface-side electrodes to be inspected of the circuit device for evaluation. On the back surface of the adaptor body, 4,800 circular terminal electrodes each having a diameter of 400 μm are arranged according to positions of lattice points having a pitch of 750 μm. The electrodes for current supply and the electrodes for volume measurement are electrically connected to the terminal electrodes in relation of one to one through an internal wiring.

The above-described anisotropically conductive connector was arranged in alignment on the connecting electrode region in the front surface of this adaptor body and fixed, thereby producing an upper-side adaptor device.

[Lower-side Adaptor Device]

A lower-side adaptor device was produced in the same manner as in the above-described upper-side adaptor device.

[Production of Inspection Apparatus]

The above-described upper-side adaptor device and lower-side adaptor device were used to produce an inspection apparatus adapted to an inspection section of a rail-conveying type automatic circuit board inspection machine (manufactured by NIDEC-READ CORPORATION, trade name: STARREC V5) according to the construction shown in FIG. 22.

In each of the upper-side inspection head and lower-side inspection head of this inspection apparatus, 4,800 pin-like inspection electrodes are arranged in its inspection electrode device according to positions of lattice points having a pitch of 750 μm.

Each of the anisotropically conductive elastomer sheets in the upper-side inspection head and lower-side inspection head is an uneven distribution type anisotropically conductive elastomer sheet, in which 4,800 conductive path-forming parts each extending in a thickness-wise direction of the sheet are mutually insulated by an insulating part. More specifically, each of the conductive path-forming parts is such that nickel particles (average particle diameter: 35 μm) plated with gold are contained in silicone rubber in a proportion of 25% in terms of a volume fraction, and the conductive path-forming parts are arranged according to positions of lattice points having a pitch of 0.75 mm. Each of the conductive path-forming parts is formed so as to protrude from both surfaces of the insulating part and has a diameter of 0.4 mm and a thickness of 0.6 mm. The projected heights from both surfaces of the insulating part are each 0.05 mm. On the other hand, the insulating part is formed by silicone rubber and has a thickness of 0.5 mm.

[Evaluation]

(1) Connection Stability Test:

The above-described inspection apparatus was installed in the inspection section of the rail-conveying type automatic circuit board inspection machine "STARREC V5", and the circuit device for evaluation was arranged in alignment in the inspection region of the inspection apparatus. A pressurizing operation was then conducted against the circuit device for evaluation under a prescribed press load. In this state, a current of 1 mA was applied between an electrode for current supply in the upper-side adaptor device and an electrode for current supply in the lower-side adaptor device to measure a voltage between an electrode for voltage measurement in the upper-side adaptor device and an electrode for voltage measurement in the lower-side adaptor device, thereby determining an electric resistance value. The number of inspection points (hereinafter referred to as "NG inspection point") at which the electric resistance value measured reached 10Ω or higher was counted. After this operation for counting the number of NG inspection points was conducted 10 times in total, a proportion (hereinafter referred to as "proportion of NG inspection points") of the number of the NG inspection points to the total number (2,400×10=24,000) of inspection points was calculated out. The process of determining such a proportion of NG inspection points was conducted by changing the press load stepwise within a range of 100 to 210 kgf, thereby determining a minimum press load (hereinafter referred to as "connectable load") under which the proportion of NG inspection points was 0.01% or lower. In actual inspection of circuit boards, it is necessary that the proportion of NG inspection points is 0.01% or lower. If the proportion of NG inspection points exceeds 0.01%, there is a possibility that a non-defective circuit board to be inspected may be judged to be a defective. It is hence difficult to conduct electrical inspection as to circuit boards with high reliability.

In the process of determining the proportion of NG inspection points, the pressurization against the circuit device for evaluation was released to bring a non-pressurized state after each operation for counting the number of NG inspection points is completed. Thereafter, next operation for counting the number of NG inspection points was conducted. The results are shown in Table 1.

In the above-described test, the smaller connectable load value indicates that the irregularity-absorbing ability in the anisotropically conductive connector is higher. Since the anisotropically conductive connector having high irregularity-absorbing ability is used, thereby achieving stable electrical connection to the circuit device under a small load, deterioration of the anisotropically conductive connector, other constructional members of the inspection apparatus, and the circuit board to be inspected by pressurization can be inhibited. As a result, the service life of the respective constructional members in the inspection apparatus can be lengthened, and members relatively low in durable may be used as the constructional members of the inspection apparatus, so that production cost of the whole inspection apparatus can be reduced.

(2) Durability Test:

The above-described inspection apparatus was installed in the inspection section of the rail-conveying type automatic circuit board inspection machine "STARREC V5", and the circuit device for evaluation was arranged in alignment in the inspection region of the inspection apparatus. A pressurizing operation was then conducted against the circuit device for evaluation under press loads of 130 kgf and 150 kgf. In this state, a current of 1 mA was applied between an electrode for current supply in the upper-side adaptor device and an electrode for current supply in the lower-side adaptor device to measure a voltage between an electrode for voltage measurement in the upper-side adaptor device and an electrode for voltage measurement in the lower-side adaptor device, thereby determining an electric resistance value to determine the number of NG inspection point, thereby calculating out a proportion of NG inspection points. This process of determining the proportion of NG inspection points was regarded as a cycle, and the cycle was conducted 30,000 times in total. In this test, the pressurization against the circuit device for evaluation was released to bring a non-pressurized state after each process for determining the proportion of NG inspection points is completed. Thereafter, next process for determining the proportion of NG inspection points was conducted. The results are shown in Table 2.

[Insulating Property Test]

The above-described inspection apparatus was installed in the inspection section of the rail-conveying type automatic circuit board inspection machine "STARREC V5", and a substrate having dimensions of 100 mm in both length and breadth and a thickness of 0.8 mm and composed of a glass fiber-reinforced epoxy resin subjected to an insulating coating treatment on the surface thereof was arranged in the inspection region of the inspection apparatus. A pressurizing operation was then conducted against the substrate under a prescribed press load to measure a voltage between an electrode for current supply and an electrode for voltage measurement in each pair of connecting electrodes in the upper-side adaptor device. The number of pairs of connecting electrodes (hereinafter referred to as "good-insulation pairs of electrodes") between which the electric resistance value measured reached 10 kΩ or higher was counted. After this operation for counting the number of good-insulation pairs of electrodes was conducted 10 times in total, a proportion (hereinafter referred to as "proportion of good-insulation pairs of electrodes") of the number of the good-insulation pairs of electrodes to the total number (2,400×10=24,000) of pairs of electrodes was calculated out. In actual inspection of circuit boards, it is necessary that the proportion of good-insulation pairs of electrodes is 99% or higher. If the proportion of good-insulation pairs of electrodes is lower than 99%, there is a possibility that a current supplied to an electrode for current supply may leak into an electrode for voltage measurement to judge a defective circuit board to be inspected to be non-defective. It is hence difficult to conduct electrical inspection as to circuit boards with high reliability. The process of determining the proportion of good-insulation pairs of electrodes was conducted by changing the press load stepwise within a range of 100 to 210 kgf. The results are shown in Table 3.

Comparative Example 1

After 400 parts by weight of conductive particles having a number average particle diameter of 12 μm were added and mixed into 100 parts by weight of addition type liquid silicone rubber, the resultant mixture was subjected to a defoaming treatment by pressure reduction, thereby preparing a material for conductive elastomer.

In the above-described process, those (average coating amount: 2% by weight of the weight of core particles) obtained by using nickel particles as core particles and subjecting the core particles to electroless plating with gold were used as the conductive particles.

After a frame-like spacer having a thickness of 60 μm and a rectangular opening of 120 mm×120 mm in dimensions was arranged on a molding surface of an other surface-side molding member, the material for conductive elastomer prepared above was applied into the opening of the spacer, and a one surface-side molding member was arranged on the material for conductive elastomer in such a manner that the molding surface thereof comes into contact with the material for conductive elastomer.

In the above-described process, polyester resin sheets having a thickness of 0.1 mm were used as the one surface-side molding member and the other surface-side molding member.

Thereafter, a press roll device composed of a press roll and a supporting roll was used to pinch the material for conductive elastomer by the one surface-side molding member and the other surface-side molding member, thereby forming a layer of the material for conductive elastomer having a thickness of 100 μm between the one surface-side molding member and the other surface-side molding member.

The layer of the material for conductive elastomer was then subjected to a curing treatment under conditions of 120° C. for 0.5 hours while applying a magnetic field of 0.3 T to the layer of the material for conductive elastomer in a thickness-wise direction thereof by electromagnets arranged on the respective back surfaces of the one surface-side molding member and the other surface-side molding member, thereby producing a rectangular anisotropically conductive elastomer sheet having a thickness of 60 μm.

An upper-side adaptor device and a lower-side adaptor device were produced in the same manner as in Example 1 except that the above-described anisotropically conductive elastomer sheet was used in place of the anisotropically conductive connector, thereby producing an inspection apparatus. This inspection apparatus was subjected to the connection stability test, durability test and insulating property test. The results are shown in Tables 1 to 3.

Comparative Example 2

After 400 parts by weight of conductive particles having a number average particle diameter of 12 μm were added and mixed into 100 parts by weight of addition type liquid silicone rubber, the resultant mixture was subjected to a defoaming treatment by pressure reduction, thereby preparing a material for conductive elastomer.

In the above-described process, those (average coating amount: 2% by weight of the weight of core particles) obtained by using nickel particles as core particles and subjecting the core particles to electroless plating with gold were used as the conductive particles.

After a frame-like spacer having a thickness of 40 μm and a rectangular opening of 120 mm×120 mm in dimensions was arranged on a molding surface of an other surface-side molding member, the material for conductive elastomer prepared above was applied into the opening of the spacer, and a one surface-side molding member was arranged on the material for conductive elastomer in such a manner that the molding surface thereof comes into contact with the material for conductive elastomer.

In the above-described process, polyester resin sheets having a thickness of 0.1 mm were used as the one surface-side molding member and the other surface-side molding member.

Thereafter, a press roll device composed of a press roll and a supporting roll was used to pinch the material for conductive elastomer by the one surface-side molding member and the other surface-side molding member, thereby forming a layer of the material for conductive elastomer having a thickness of 50 μm between the one surface-side molding member and the other surface-side molding member.

The layer of the material for conductive elastomer was then subjected to a curing treatment under conditions of 120° C. for 0.5 hours while applying a magnetic field of 0.3 T to the layer of the material for conductive elastomer in a thickness-wise direction thereof by electromagnets arranged on the respective back surfaces of the one surface-side molding member and the other surface-side molding member, thereby producing a rectangular anisotropically conductive elastomer sheet having a thickness of 40 μm.

An upper-side adaptor device and a lower-side adaptor device were produced in the same manner as in Example 1 except that the above-described anisotropically conductive elastomer sheet was used in place of the anisotropically conductive connector, thereby producing an inspection apparatus. This inspection apparatus was subjected to the connection stability test, durability test and insulating property test. However, the durability test was conducted under press loads of 150 kgf and 180 kgf. The results are shown in Tables 1 to 3.

TABLE 1

| Press Load | Proportion of NG inspection points (%) | | | | | | Connectable Load |
|---|---|---|---|---|---|---|---|
| (kgf) | 100 | 110 | 130 | 150 | 180 | 210 | (kgf) |
| Example 1 | 0.3 | 0 | 0 | 0 | 0 | 0 | 110 |
| Comparative Example 1 | 4.5 | 0.5 | 0 | 0 | 0 | 0 | 130 |
| Comparative Example 2 | 8.3 | 3.1 | 0.8 | 0 | 0 | 0 | 150 |

TABLE 2

| | Press Load | Proportion of NG inspection points (%) | | | | |
|---|---|---|---|---|---|---|
| | (kgf) | 1st | 1000th | 5000th | 10000th | 30000th |
| Example 1 | 130 | 0 | 0 | 0 | 0 | 0 |
| | 150 | 0 | 0 | 0 | 0 | 0.13 |
| Comparative Example 1 | 130 | 0 | 0 | 0.1 | 1.6 | Not done |
| | 150 | 0 | 0 | 0.2 | 1.1 | Not done |
| Comparative Example 2 | 150 | 0 | 0 | 1.8 | Not done | Not done |
| | 180 | 0 | 0.3 | 3.2 | Not done | Not done |

TABLE 3

| Press Load | Proportion of good-insulation pairs of electrodes (%) | | | | | |
|---|---|---|---|---|---|---|
| (kgf) | 100 | 110 | 130 | 150 | 180 | 210 |
| Example 1 | 100 | 100 | 100 | 100 | 100 | 100 |
| Comparative Example 1 | 99.5 | 99.3 | 99.3 | 99.4 | 98.1 | 94.2 |
| Comparative Example 2 | 100 | 100 | 100 | 99.5 | 99.2 | 98.3 |

As apparent from the results shown in Tables 1 to 3, according to the anisotropically conductive connector of Example 1, high irregularity-absorbing ability equivalent to the anisotropically conductive elastomer sheet (Comparative Example 1) having a thickness of 100 μm is achieved, and moreover high resolving power equivalent to the anisotropically conductive elastomer sheet (Comparative Example 2) having a thickness of 50 μm is achieved. In addition, stable electrical connection is achieved under a low load. It was hence confirmed that a long service life is achieved when it is used in an inspection apparatus.

The invention claimed is:

1. An adaptor device comprising:
    an adaptor body that includes a connecting electrode region, on a surface of which a plurality of connecting electrodes are formed in accordance with a pattern corresponding to electrodes to be inspected in a circuit device to be inspected; and
    an anisotropically conductive connector arranged on the connecting electrode region of the adaptor body, wherein the anisotropically conductive connector includes a composite conductive sheet that includes an insulating sheet, in which a plurality of through-holes each extending in a thickness-wise direction of the sheet are formed, and rigid conductors arranged respectively in the through-holes in the insulating sheet so as to protrude from both surfaces of the insulating sheet, wherein each of the rigid conductors has terminal portions formed on both ends of a body portion inserted into the through-hole in the insulating sheet and each includes a diameter greater than a diameter of the through-hole in the insulating sheet, and is movable in the thickness-wise direction of the insulating sheet, and the rigid conductors are arranged in accordance with a pattern that corresponds to the connecting electrodes in the adaptor body, and a first anisotropically conductive elastomer sheet arranged on one surface of the composite conductive sheet and a second anisotropically conductive elastomer sheet arranged on the other surface of the composite conductive sheet.

2. The adaptor device according to claim 1, wherein a movable distance of the rigid conductor in the thickness-wise direction of the insulating sheet is 3 to 150 μm in the composite conductive sheet.

3. The adaptor device according to claim 1, wherein each of the first anisotropically conductive elastomer sheet and second anisotropically conductive elastomer sheet contains conductive particles that exhibit magnetism in a state that the conductive particles have been oriented in an elastic polymeric substance so as to align in a thickness-wise direction of the sheet to form chains, and in a state that the chains formed of the conductive particles have been distributed in a plane direction of the sheet.

4. The adaptor device according to claim 3, wherein each of the first anisotropically conductive elastomer sheet and second anisotropically conductive elastomer sheet has a thickness of 20 to 100 μm.

5. The adaptor device according to claim 4, wherein the conductive particles have a number average particle diameter of 3 to 20 μm.

6. An adaptor device comprising:

an adaptor body that includes a connecting electrode region, on a surface of which plural pairs of connecting electrodes each composed of two connecting electrodes for current supply and for voltage measurement are formed in accordance with a pattern corresponding to electrodes to be inspected in a circuit device to be inspected, and an anisotropically conductive connector arranged on the connecting electrode region of the adaptor body, wherein the anisotropically conductive connector includes a composite conductive sheet that includes an insulating sheet, in which a plurality of through-holes each extending in a thickness-wise direction of the sheet are formed, and rigid conductors arranged respectively in the through-holes in the insulating sheet so as to protrude from both surfaces of the insulating sheet, wherein each of the rigid conductors has terminal portions formed on both ends of a body portion inserted into the through-hole in the insulating sheet and each includes a diameter greater than a diameter of the through-hole in the insulating sheet, and is movable in the thickness-wise direction of the insulating sheet, and the rigid conductors are arranged in accordance with a pattern that corresponds to the connecting electrodes in the adaptor body, and a first anisotropically conductive elastomer sheet arranged on one surface of the composite conductive sheet and a second anisotropically conductive elastomer sheet arranged on the other surface of the composite conductive sheet.

7. The adaptor device according to claim 6, wherein a movable distance of the rigid conductor in the thickness-wise direction of the insulating sheet is 3 to 150 μm in the composite conductive sheet.

8. The adaptor device according to claim 6, wherein each of the first anisotropically conductive elastomer sheet and second anisotropically conductive elastomer sheet contains conductive particles that exhibit magnetism in a state that the conductive particles have been oriented in an elastic polymeric substance so as to align in a thickness-wise direction of the sheet to form chains, and in a state that the chains formed of the conductive particles have been distributed in a plane direction of the sheet.

9. The adaptor device according to claim 8, wherein each of the first anisotropically conductive elastomer sheet and second anisotropically conductive elastomer sheet has a thickness of 20 to 100 μm.

10. The adaptor device according to claim 9, wherein the conductive particles have a number average particle diameter of 3 to 20 μm.

11. An inspection apparatus for circuit devices, comprising the adaptor device according to claim 1.

12. An inspection apparatus for circuit devices, comprising the adaptor device according to claim 6.

* * * * *